US011867738B2

(12) United States Patent
Salazar-Cerreno

(10) Patent No.: US 11,867,738 B2
(45) Date of Patent: Jan. 9, 2024

(54) MULTIPURPOSE MILLIMETER-WAVE RADIO FREQUENCY SYSTEM AND METHODS OF USE

(71) Applicant: The Board of Regents of the University of Oklahoma, Norman, OK (US)

(72) Inventor: Jorge Luis Salazar-Cerreno, Norman, OK (US)

(73) Assignee: The Board of Regents of the University of Oklahoma, Norman, OK (US)

( * ) Notice: Subject to any disclaimer, the term of this patent is extended or adjusted under 35 U.S.C. 154(b) by 365 days.

(21) Appl. No.: 17/364,208

(22) Filed: Jun. 30, 2021

(65) Prior Publication Data
US 2021/0405103 A1     Dec. 30, 2021

Related U.S. Application Data

(60) Provisional application No. 63/046,389, filed on Jun. 30, 2020.

(51) Int. Cl.
| | |
|---|---|
| *G01R 29/10* | (2006.01) |
| *G01R 29/08* | (2006.01) |
| *H04B 17/10* | (2015.01) |

(52) U.S. Cl.
CPC ....... *G01R 29/105* (2013.01); *G01R 29/0878* (2013.01); *G01R 29/0892* (2013.01); *H04B 17/102* (2015.01)

(58) Field of Classification Search
CPC .............. G01R 29/105; G01R 29/0878; G01R 29/0892; G01R 29/10; H04B 17/102; H04B 17/12

USPC .......................................................... 343/703
See application file for complete search history.

(56) References Cited

U.S. PATENT DOCUMENTS

| | | | | |
|---|---|---|---|---|
| 8,471,774 | B2* | 6/2013 | Oh ........................ | G01R 29/10 |
| | | | | 343/703 |
| 2010/0149038 | A1* | 6/2010 | Brown ................... | G01R 29/10 |
| | | | | 342/360 |

OTHER PUBLICATIONS

Aboserwal, N. A.; Salazar, J. L.; Member, S.; Ortiz, J. A.; Member, S.; Diaz, J. D.; Member, S.; Fulton, C.; Member, S.; and Palmer, R. D., "Source Current Polarization Impact on the Cross-Polarization Definition of Practical Antenna Elements: Theory and Applications," IEEE Trans. Antennas Propag., vol. 66, No. 9, pp. 4391-4406, 2018.

(Continued)

*Primary Examiner* — Khai M Nguyen
(74) *Attorney, Agent, or Firm* — DUNLAP CODDING, P.C.

(57) ABSTRACT

An apparatus for a mmWave RF scanner system is described that enables multiple modes of operation. The disclosed RF scanner may be configured to perform a variety of independent tasks, including antenna measurement in far-field or near-field mode, active array characterization, radome measurements, and material characterization. To achieve all proposed measurements, a nine-axis RF scanner system is disclosed. For all modes, the system may use a two-port vector network analyzer (100 kHz to 9 GHz) connected to a plurality of frequency extenders that increases the operating range from 75 GHz to 110 GHz. The system may also include a graphical user interface for autonomous operation in each mode.

22 Claims, 19 Drawing Sheets

(56) References Cited

OTHER PUBLICATIONS

Aumann, H. M.; Fenn, A. J.; and Willwerth, F. G., "Phased Array Antenna Calibration and Pattern Prediction Using Mutual Coupling Measurements," IEEE Transactions on Antennas and Propagation, vol. 37, No. 7, pp. 844-850, 1989.
Boehm, L.; Boegelsack, F.; Hitzler, M.; and Waldschmidt, C., "The Challenges of Measuring Integrated Antennas at Millimeter-Wave Frequencies [Measurements Corner]," IEEE Antennas Propag. Mag., vol. 59, No. 4, pp. 84-92, 2017.
Boehm, L.; Boegelsack, F.; Hitzler, M.; Wiehler, S.; and Waldschmidt, C., "Accuracy Evaluation for Antenna Measurements at mm-Wave Frequencies," 2016 10th Eur. Conf. Antennas Propagation, EuCAP 2016, 2016.
Bosco, B.; Emrick R.; Franson, S; Holmes, J. and Rockwell, S., "Emerging Commercial Applications Using the 60 GHz Unlicensed Band: Opportunities and Challenges," IEEE Wirel. Microw. Technol. Conf. WAMICON 2006, pp. 6-9, 2006.
Brockett, T. and Rahmat-Samii, Y., "A Novel Portable Bipolar Nearfield Measurement System for Millimeter-wave Antennas: Construction, Development, and Verification," IEEE Antennas Propag. Mag., vol. 50, No. 5, pp. 121-130, 2008.
Chen, Z.; Zhang, Y. P.; Bisognin, A.; Titz, D.; Ferrero, F.; and Luxey, C., "A 94-GHz Dual-Polarized Microstrip Mesh Array Antenna in LTCC Technology," IEEE Antennas Wirel. Propag. Lett., vol. 15, pp. 634-637, 2016.
Fitzek, F. and Rasshofer, R. H., "Automotive radome design—Reflection reduction of stratified media," IEEE Antennas Wirel. Propag. Lett., vol. 8, pp. 1076-1079, 2009.
Fitzek, F.; Rasshofer, R. H.; and Biebl, E. M., "Comparison of Matching Layers for Automotive Radome Design," Adv. Radio Sci., vol. 8, No. 2005, pp. 49-54, 2010.
Fralick, D. T. and Cravey, R., "W-band Free Space Permittivity Measurement System for Candidate Radome Materials," AMTA 19th Annu. Meet. Symp., No. Aug. 1997.
Gordon, J. A.; Novotny, D. R.; Francis, M. H.; Wittmann, R. C.; Butler, M. L.; Curtin, A. E.; and Guerrieri, J. R.; "Millimeter-Wave Near-Field Measurements Using Coordinated Robotics," IEEE Trans. Antennas Propag., vol. 63, No. 12, pp. 5351-5362, 2015.
Guerrieri, J. R.; Gordon, J.; Novotny, D.; Francis, M.; Wittmann, R.; and Butler, M., "Configurable Robotic Millimeter-Wave Antenna Facility," 2015 9th Eur. Conf. Antennas Propagation, EuCAP 2015, pp. 1-2, 2015.
Hasch, J.; Topak, E.; Schnabel, R.; Zwick, T.; Weigel, R.; and Waldschmidt, C., "Millimeter-wave Technology for Automotive Radar Sensors in the 77 GHz Frequency Band," IEEE Trans. Microw. Theory Tech., vol. 60, No. 3 Part 2, pp. 845-860, 2012.
Hilario, M. S.; Hoff, B. W.; Jawdat, B.; Lanagan, M. T.; Cohick, Z. W.; Dynys, F. W.; Mackey, J. A.; and Gaone, J. M., "W-Band Complex Permittivity Measurements at High Temperature Using Free-Space Methods," IEEE Trans. Components, Packag. Manuf. Technol., vol. 9, No. 6, pp. 1011-1019, 2019.
IEEE, "IEEE Recommended Practice for Near-Field Antenna Measurements," IEEE Std 1720-2012, pp. 1-102, 2012.
Jarvelainen, J.; Karttunen, A.; Aurinsalo, J.; Huhtinen, I.; and Hujanen, A., "Characterization of mm-Wave Radomes for Base Stations and Automotive Radars," 13th Eur. Conf. Antennas Propagation, EuCAP 2019, vol. 2, No. EuCAP, pp. 1-5, 2019.
Koenen, C.; Hamberger, G.; Siart, U.; and Eibert, T. F., "A Volumetric Near-field Scanner for Millimeter-wave Antenna Measurements," 2016 10th Eur. Conf. Antennas Propagation, EuCAP 2016, pp. 1-4, 2016.
Lebron, R. M.; Tsai, P.; Emmett, J. M.; Fulton, C.; and Salazar-Cerreno, J. L., "Validation and Testing of Initial and In-Situ Mutual Coupling-Based Calibration of a Dual-Polarized Active Phased Array Antenna," IEEE Access, vol. 8, pp. 78 315-78 329, 2020.
Lebron, R.; Diaz, J. D.; and Salazar-Cerreno, J. L., "A Procedure to Characterize and Predict Active Phased Array Antenna Radiation Patterns from Planar Near-Field Measurements," in Annual Meeting and Symposium of the Antenna Measurement Techniques Association, 2018.
Lebron, R.; Salazar, J.; Fulton, C.; Schmidt, D.; and Palmer, R., "A Novel Near-field Robotic Scanner for Surface, RF and Thermal Characterization of Millimeter-Wave Active Phased Array Antenna," in Fifth International Symposium on Phased Array Systems and Technology, Boston, MA, 2016.
Ludwig, A. C., "The Definition of Cross Polarization," IEEE Transactions on Antennas and Propagation, pp. 116-119, 1973.
Mulcahey, J. K. and Sarcione, M. G., "Calibration and Diagnostics of the THAAD Solid State Phased Array in a Planar Nearfield Facility," Proceedings IEEE International Conference on Phased Array Systems and Technology, pp. 322-326, 1996.
Qamar, Z.; Aboserwal, N.; and Salazar-Cerreno, J. L., "An accurate method for designing, characterizing, and testing a multi-layer radome for mm-wave applications," IEEE Access, vol. 8:23041-23053, Jan. 30, 2020.
Seker, I., "Calibration Methods for Phased Array Radars," Proceedings of SPIE, vol. 8714, pp. 87 140W-1 87 140W-15, 2013.
Smith, D. R.; Padilla, W. J.; Vier, D.; Nemat-Nasser, S. C.; and Schultz, S., "Composite Medium with Simultaneously Negative Permeability and Permittivity," Physical review letters, vol. 84, No. 18, p. 4184-4187, 2000.
Yaghjian, A., "An Overview of Near-field Antenna Measurements," IEEE Transactions on Antennas and Propagation, vol. 34, No. 1, pp. 30-45, 1986.

* cited by examiner

MULTIPURPOSE MILLIMETER-WAVE RADIO FREQUENCY SYSTEM AND METHODS OF USE

CROSS REFERENCE TO RELATED APPLICATIONS AND INCORPORATION BY REFERENCE STATEMENT

The present patent application claims priority under 37 CFR § 119(e) to United States Provisional Patent Application U.S. Ser. No. 63/046,389, filed on Jun. 30, 2020, the entire contents of which are hereby expressly incorporated herein by reference.

STATEMENT REGARDING FEDERALLY SPONSORED RESEARCH OR DEVELOPMENT

Not applicable.

BACKGROUND

In recent years, the number of applications operating in frequencies higher than 30 GHz has increased substantially. The new generation of mobile communication (i.e., 5G) is using a large portion of the millimeter spectrum (i.e., 28-34 GHz) to satisfy the explosive demand of channel capacity (i.e., 10-20 Gbps) in wireless systems. At higher frequencies, point-to-point communication links use the 57-66 GHz, 71-76 GHz, 81-86 GHz, and 92-95 GHz bands to increase capacity. The automobile industry uses the 76-81 GHz band for long-range radar (also referred to as "LRR") and short-range radar (also referred to as "SRR") for adaptive cruise control (also referred to as "ACC") and collision avoidance. Recently, passive array antennas used in the automotive radar system have been upgraded with electronically scanned active arrays. Active phased array antenna technology enables faster scanning rates and enhances detection of weak targets. Such systems require mmWave components such as antennas, active arrays, filters, RF substrates, radomes, and other parts that require accurate and automated RF characterization.

To test and characterize mmWave components, RF scanners have been developed to operate in a far-field mode or a near-field mode. The selection of which mode to use depends on test antenna, space, and budget. For mmWave applications, far-field measurements are cost-effective and simple to implement. However, the far-field mode requires space to measure the test antenna in the far-field region. To overcome space constraints in the far-field mode, compact antenna test ranges (also referred to as "CATR") and near-field planar test ranges (also referred to as "NFP") allow electrically large antennas to be measured within a smaller environment. CATR uses, in general, a source antenna (feed) to radiate a spherical wave in the direction of a parabolic reflector, collimating it into a planar wave for aperture illumination of a test antenna. Rolled-edge reflector and multiple-feed systems may be used to improve far-field radiation characteristics.

One approach that offers flexibility to perform different antenna modes in the near-field region uses an RF probe mounted on a robotic arm. This system is highly flexible and enables the measurement of integrated antennas at frequencies above 100-280 GHz. Similarly, a robotic arm has been used for mmWave antenna measurements. The robotic arm system has the ability to reconfigure for near-field or far-field antenna measurement for the 100-500 GHz frequency band.

Another proposed RF scanner system used a six-axis robotic arm for microwave and mmWave measurements. This system used an articulated robot to move a sensor suite to perform near-field antenna pattern measurements and active array calibration, as well as surface and thermal inspection of a test antenna.

Phased array technology has increased in popularity over the last two decades due to the fast-growing market of mmWave devices for 5G and automotive radar applications. The success of the implementation of phased arrays can only be guaranteed if their correct application (i.e., proper beam synthesis) is ensured. For this, calibration of the array is crucial to define the correct excitation of the antenna elements that will yield the desired antenna pattern. In order to quantify and correct excitation imperfections, several techniques have been proposed over the last four decades. Active array calibration in the mmWave region requires accurate probe position to perform a park-and-probe calibration procedure, which is one of the most used techniques in phased array applications. In the mmWave region, an automated RF scanner that can perform accurate and repeatable measurements in the near-field region is imperative to calibrate an active phased array.

Characterization of materials and radomes to be used in the mmWave region is critical for the development of front-end systems. At those frequencies, radome and RF materials have been characterized and tested using the free-space method. This technique requires an automated measurement setup in which the frequency extenders and test material require precise alignment.

Most of the existing mmWave RF scanners for antenna, radome, or material tests are systems developed to use their own setups, space, and RF instrumentation. Taking into consideration that the mmWave equipment, cables, waveguides, and probe antennas are extremely expensive, having a dedicated set for each operation mode is not cost-effective. Moving equipment from one setup to another for different modes of operation increases the risk of damage to the RF equipment and adds personnel and operational costs.

DETAILED DESCRIPTION

Figure 1A:
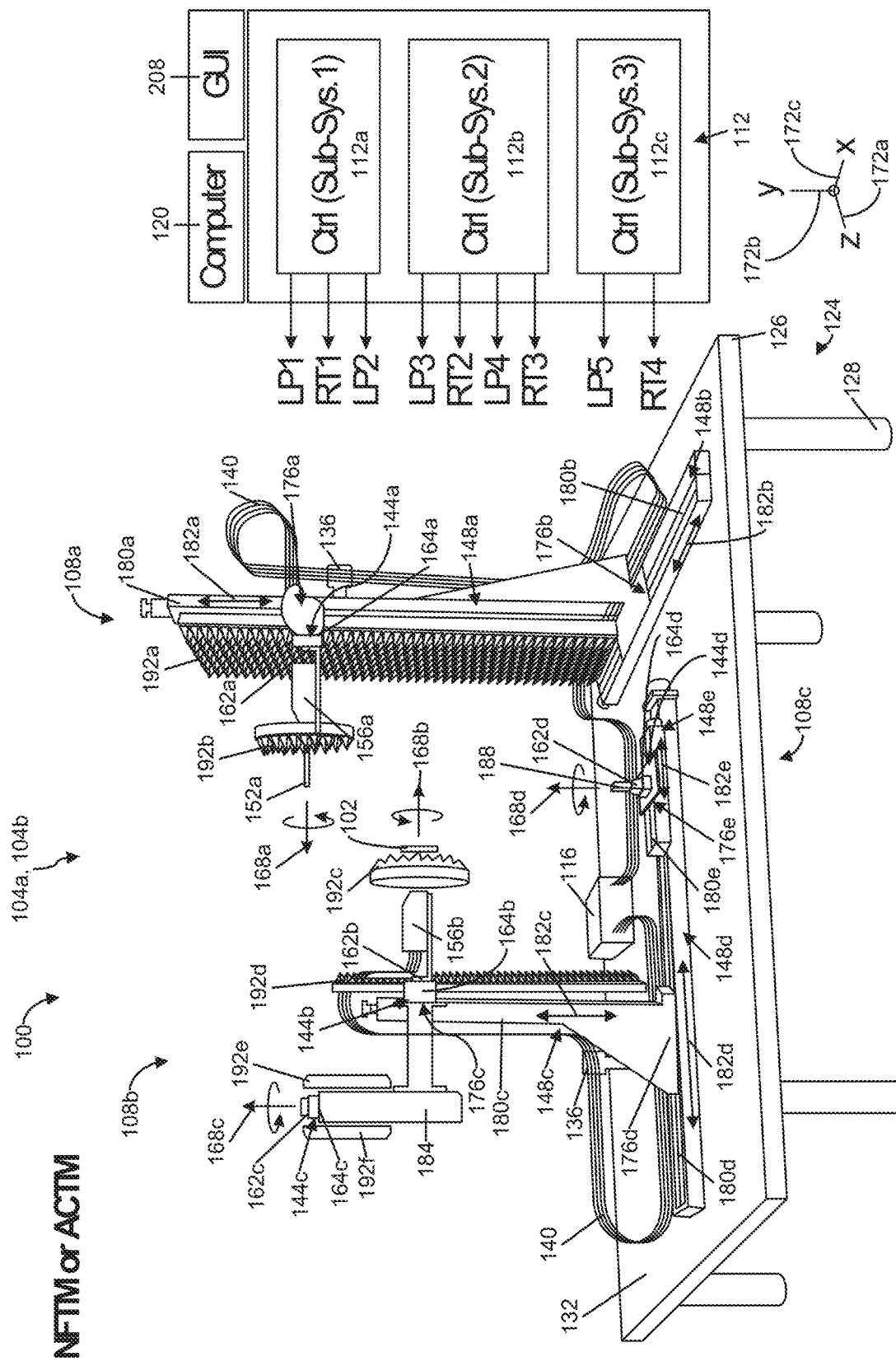
FIG. 1A is a perspective view of an exemplary multipurpose mmWave RF scanner of the present disclosure configured in a near-field planar antenna test mode or an active array calibration test mode.

Disclosed herein is a multipurpose millimeter-wave (also referred to as "mmWave") RF scanner system to perform antenna measurement, active array calibration, material characterization, and radome testing. In a non-limiting embodiment, the RF scanner system shares one set of RF instrumentation and probe antennas for a plurality of operating modes. In certain non-limiting embodiments, the RF scanner system includes a computer system with a graphical user interface that provides autonomous operation, permitting accurate, reliable, and repeatable measurements in all operation modes. The RF scanner system includes mmWave RF components. In one non-limiting embodiment, the multipurpose RF scanner system comprising a nine-axis fully automated RF scanner that enables antenna measurements in the near-field and far-field, active array calibration, material characterization, and radome testing. The presently disclosed RF scanner system is a cost-effective solution for mmWave applications that operate between 75 GHz and 110 GHz. Modular architecture of the RF scanner system enables multiple modes of operation making this system a unique and attractive solution for mmWave applications.

Before describing various embodiments of the present disclosure in more detail by way of exemplary description, examples, and results, it is to be understood that the embodiments of the present disclosure are not limited in application to the details of methods and apparatus as set forth in the following description. The embodiments of the present disclosure are capable of other embodiments or of being practiced or carried out in various ways. As such, the language used herein is intended to be given the broadest possible scope and meaning; and the embodiments are meant to be exemplary, not exhaustive. Also, it is to be understood that the phraseology and terminology employed herein is for the purpose of description and should not be regarded as limiting unless otherwise indicated as so. Moreover, in the following detailed description, numerous specific details are set forth in order to provide a more thorough understanding of the disclosure. However, it will be apparent to a person having ordinary skill in the art that the present disclosure may be practiced without these specific details. In other instances, features which are well known to persons of ordinary skill in the art have not been described in detail to avoid unnecessary complication of the description.

Unless otherwise defined herein, scientific and technical terms used in connection with the present disclosure shall have the meanings that are commonly understood by those having ordinary skill in the art. Further, unless otherwise required by context, singular terms shall include pluralities and plural terms shall include the singular.

All patents, published patent applications, and non-patent publications mentioned in the specification are indicative of the level of skill of those of ordinary skill in the art to which the present disclosure pertains. All patents and published patent applications referenced in any portion of this application are herein expressly incorporated by reference in their entirety to the same extent as if each individual patent or publication was specifically and individually indicated to be incorporated by reference.

While the devices and methods of the present disclosure have been described in terms of particular embodiments, it will be apparent to those of skill in the art that variations may be applied to the devices and/or methods and in the steps or in the sequence of steps of the method described herein without departing from the concept, spirit, and scope of the inventive concepts. All such similar substitutes and modifications apparent to those of ordinary skill in the art are deemed to be within the spirit and scope of the inventive concepts as disclosed herein.

The processes described in the present disclosure can be performed with the aid of a computer system running software adapted to perform the functions, and the resulting images and data may be stored on one or more non-transitory computer readable mediums. Examples of a non-transitory computer readable medium include an optical storage device, a magnetic storage device, an electronic storage device or the like. The term "Computer System" as used herein means a system or systems that are able to embody and/or execute the logic of the processes described herein. The logic embodied in the form of software instructions or firmware may be executed on any appropriate hardware which may be a dedicated system or systems, or a specially programmed computer system, or distributed processing computer system. When the computer system is used to execute the logic of the processes described herein, such computer(s) and/or execution can be conducted at a same geographic location or multiple different geographic locations. Furthermore, the execution of the logic can be conducted continuously or at multiple discrete times. Further, such logic can be performed about simultaneously with the capture of the optical images, thermal images, RF information, or thereafter or combinations thereof.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or when the alternatives are mutually exclusive, although the disclosure supports a definition that refers to only alternatives and "and/or." The use of the term "at least one" will be understood to include one as well as any quantity more than one, including but not limited to, 2, 3, 4, 5, 6, 7, 8, 9, 10, 15, 20, 30, 40, 50, 100, or any integer inclusive therein. The term "at least one" may extend up to 100 or 1000 or more, depending on the term to which it is attached; in addition, the quantities of 100/1000 are not to be considered limiting, as higher limits may also produce satisfactory results. In addition, the use of the term "at least one of X, Y and Z" will be understood to include X alone, Y alone, and Z alone, as well as any combination of X, Y and Z.

As used herein, all numerical values or ranges include fractions of the values and integers within such ranges and fractions of the integers within such ranges unless the context clearly indicates otherwise. Thus, to illustrate, reference to a numerical range, such as 1-10 includes 1, 2, 3, 4, 5, 6, 7, 8, 9, 10, as well as 1.1, 1.2, 1.3, 1.4, 1.5, etc., and so forth. Reference to a range of 1-50 therefore includes 1, 2, 3, 4, 5, 6, 7, 8, 9, 10, 11, 12, 13, 14, 15, 16, 17, 18, 19, 20, etc., up to and including 50, as well as 1.1, 1.2, 1.3, 1.4, 1.5, etc., 2.1, 2.2, 2.3, 2.4, 2.5, etc., and so forth. Reference to a series of ranges includes ranges which combine the values of the boundaries of different ranges within the series. Thus, to illustrate reference to a series of ranges, for example, of 1-10, 10-20, 20-30, 30-40, 40-50, 50-60, 60-75, 75-100, 100-150, 150-200, 200-250, 250-300, 300-400, 400-500, 500-750, 750-1,000, includes ranges of 1-20, 10-50, 50-100, 100-500, and 500-1,000, for example. Reference to an integer with more (greater) or less than includes any number greater or less than the reference number, respectively. Thus, for example, reference to less than 100 includes 99, 98, 97, etc. all the way down to the number one (1); and less than 10 includes 9, 8, 7, etc. all the way down to the number one (1).

As used in this specification, the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps. For example, unless otherwise noted, a process, method, article, or apparatus that comprises a list of elements is not necessarily limited to only those elements but may also include other elements not expressly listed or inherent to such process, method, article, or apparatus.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more items or terms, such as BB, AAA, AAB, BBC, AAABCCCC, CBBAAA, CABABB, and so forth. One of ordinary skill in the art will understand that typically there is no limit on the number of items or terms in any combination, unless otherwise apparent from the context.

As used herein, any reference to "one embodiment," "an embodiment," "some embodiments," "one example," "for example," or "an example" means that a particular element, feature, structure, or characteristic described in connection with the embodiment is included in at least one embodiment and may be included in other embodiments. The appearance of the phrase "in some embodiments" or "one example" in various places in the specification is not necessarily all referring to the same embodiment, for example, and are not necessarily limited to a single or particular embodiment. In addition, the use of the terms "one embodiment" and "an embodiment" are not to be construed as limiting in any matter of the scope of the present disclosure; unless indicated otherwise, all references to "embodiment(s)" and "example(s)" will be understood to mean "non-limiting embodiment(s)" and "non-limiting example(s)."

Throughout this application, the terms "about" or "approximately" are used to indicate that a value includes the inherent variation of error for the compositions and/or methods of the present disclosure. As used herein, the qualifiers "about" or "approximately" are intended to include not only the exact value, amount, degree, orientation, or other qualified characteristic or value, but are intended to include some slight variations due to measuring error, manufacturing tolerances, stress exerted on various parts or components, observer error, wear and tear, and combinations thereof, for example. The term "about," where used herein when referring to a measurable value such as an amount, a temporal duration, and the like, is meant to encompass variations of ±20%, or ±10%, or ±5%, or ±1%, or ±0.1% from the specified value, as such variations are appropriate to perform the disclosed methods and as understood by persons having ordinary skill in the art. Throughout this application, the term "about" is used to indicate that a value includes the inherent variation of error for measuring various parameters. Further, in this detailed description and the appended claims, each numerical value (e.g., temperature or time) should be read once as modified by the term "about" (unless already expressly so modified), and then read again as not so modified unless otherwise indicated in context. Also, any range listed or described herein is intended to include, implicitly or explicitly, any number within the range, particularly all integers, including the end points, and is to be considered as having been so stated. For example, "a range of from 1 to 10" is to be read as indicating each possible number, particularly (but not by way of limitation) integers, along the continuum between about 1 and about 10. Thus, even if specific data points within the range, or even no data points within the range, are explicitly identified or specifically referred to, it is to be understood that any data points within the range are to be considered to have been specified in the present disclosure, and that the inventors possessed knowledge of the entire range and the points within the range.

As used herein, the term "substantially" means that the subsequently described event, circumstance, or object completely occurs, or that the subsequently described event, circumstance, or object occurs to a great extent or degree. For example, the term "substantially" means that the subsequently described event, circumstance, or object occurs at least 75% of the time, or at least 80% of the time, or at least 85% of the time, or at least 90% of the time, or at least 95% of the time, or at least 98% of the time. Alternatively, the term "substantially" means that the subsequently described event, circumstance, or object is present in at least 75%, at least 80%, at least 85%, at least 90%, at least 95%, or at least 98% of the cases. The term "primarily" is intended to mean greater than 50%. The term "substantially" is intended to be a more limited example of "primarily."

Turning now to the description of particular non-limiting embodiments of the present disclosure, a RF scanner system 100 of the present disclosure is a multipurpose mmWave radio frequency scanner system having a modular design that allows the use of the same hardware, RF instruments, and software to perform a variety of different RF tests in a frequency range in the extremely high frequency band (also referred to as "EHF") (i.e., 75-110 GHz). The RF scanner system 100 may be used to test, calibrate, and/or characterize a test device 102 (also referred to as "device under test" or "DUT").

Figure 1B:
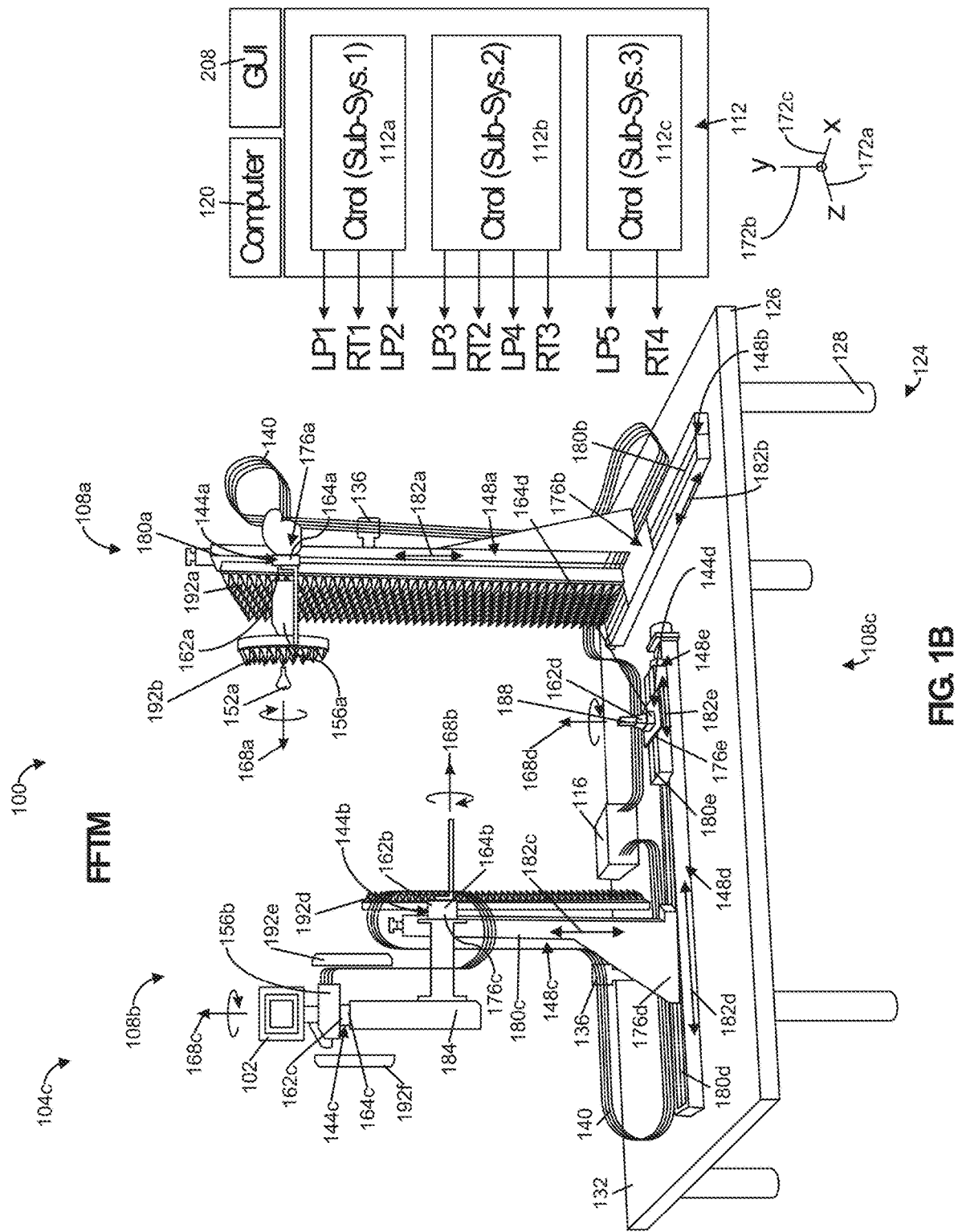
FIG. 1B is a perspective view of the exemplary multipurpose mmWave RF scanner of the present disclosure configured in a far-field planar antenna test mode.
Figure 1C:
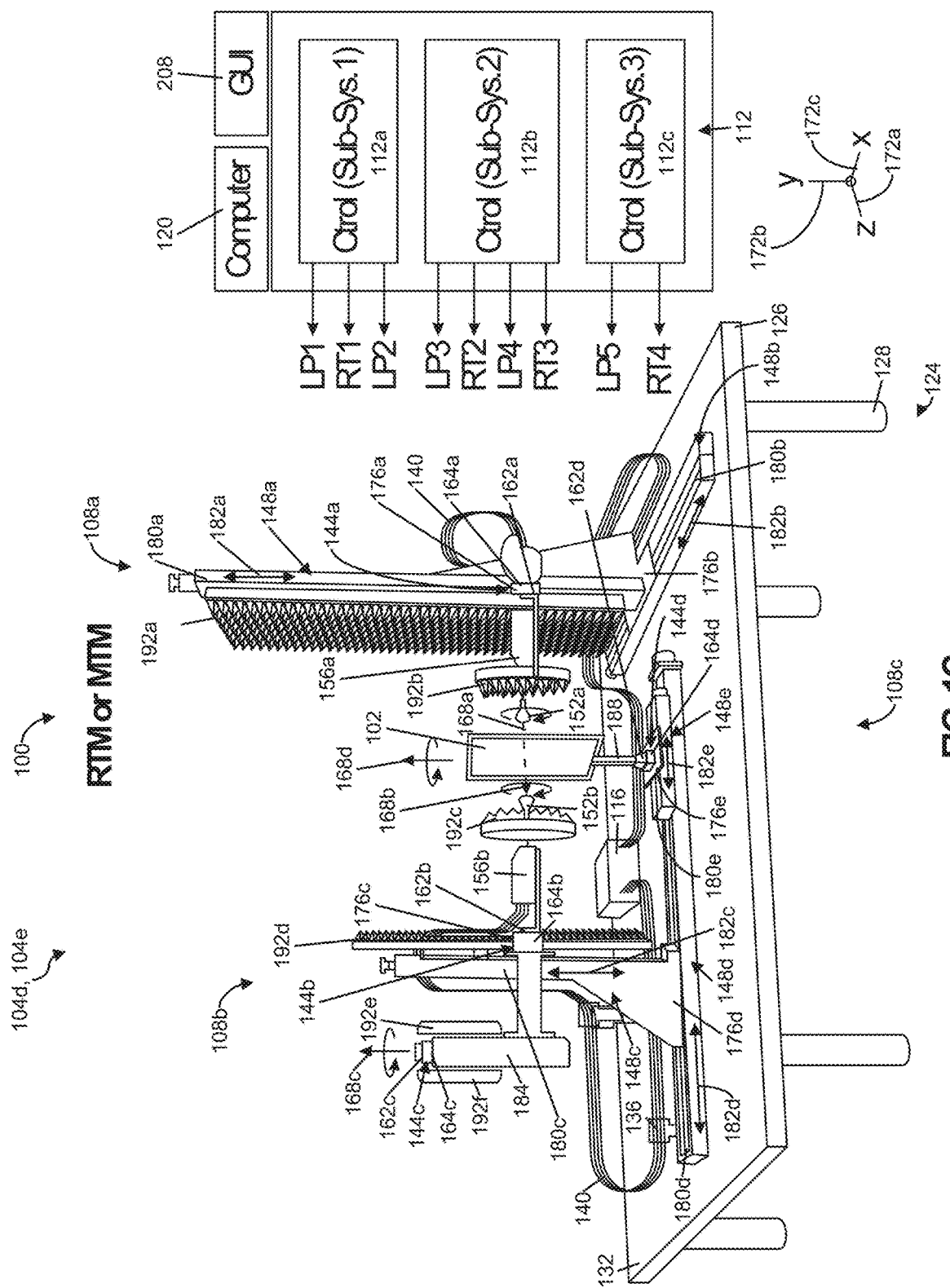
FIG. 1C is a perspective view of the exemplary multipurpose mmWave RF scanner of the present disclosure configured in a radome test mode and a material test mode.
Figure 1D:
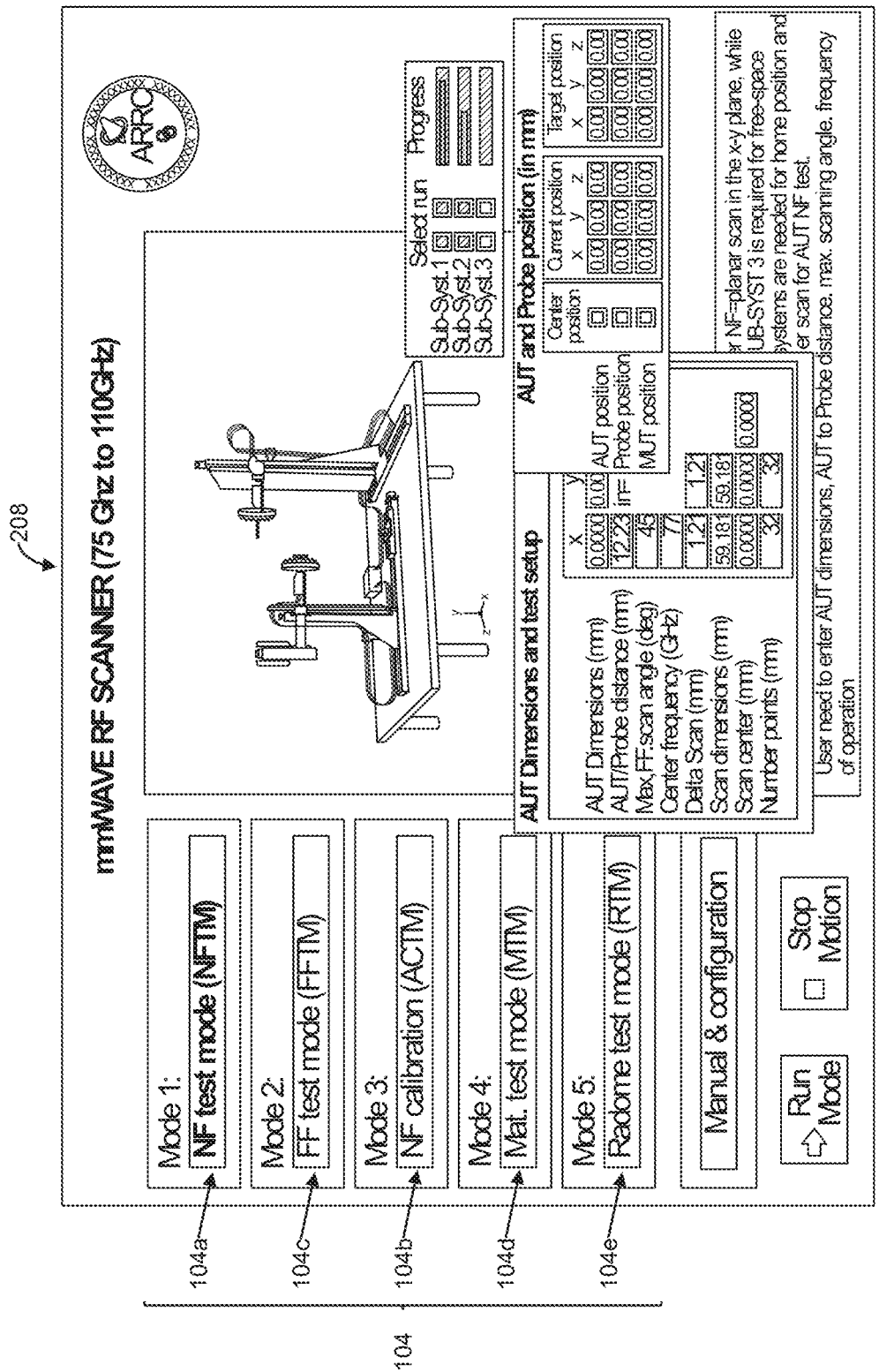
FIG. 1D is an example of a graphical user interface for the near-field planar antenna test mode.

The RF scanner system 100 may be configurable to operate in a plurality of operating modes 104 (see FIG. 1D), the plurality of operating modes 104 including a near-field planar antenna test mode (also referred to as "NFTM") 104a, a near-field active array antenna calibration test mode (also referred to as "ACTM") 104b, a far-field planar antenna test mode (also referred to as "FFTM") 104c, a material test mode (also referred to as "MTM") 104d, and a radome test mode (also referred to as "RTM") 104e. TABLE 1 describes general specifications of the RF scanner system 100 in each of the plurality of operating modes 104. FIG. 1A shows the RF scanner system 100 configured in the near-field planar antenna test mode 104a and the active array antenna calibration test mode 104b. FIG. 1B shows the RF scanner system 100 configured in the far-field planar antenna test mode 104c. FIG. 1C shows the RF scanner system 100 configured in the material test mode 104d, and the radome test mode 104e. FIG. 1D illustrates a graphical user interface for permitting user selection of any one or more of the operating modes 104.

When the RF scanner system 100 is in the near-field planar antenna test mode 104a, the active array calibration test mode 104b, or the far-field planar antenna test mode 104c, the test device 102 may be a test antenna (also referred to as "antenna under test" or "AUT"). When the RF scanner system 100 is in the material test mode 104d, the test device 102 may be a test material (also referred to as "material under test" or "MUT"). When the system 100 is in the radome test mode 104e, the test device 102 may be a test radome (also referred to as "radome under test" or "RUT").

For each of the plurality of operating modes 104, the RF scanner system 100 may include the same hardware and software. This may include a plurality of subsystems 108, a plurality of controllers 112, a vector network analyzer (also referred to as "VNA") 116, and one or more computer system 120. This allows the RF scanner system 100 to be utilized for multiple tasks in a manner that is ideal for reducing both costs and physical space requirements.

In order to facilitate modular configuration with minimal change to the hardware, the RF scanner system 100 may be implemented on one or more table 124 having a table top 126, and one or more table leg 128 supporting the table top 126. The table top 126 has one or more support surface 132. The one or more table 124 may be configured to enable independent movement of each of the plurality of subsystems 108 on the one or more support surface 132 of the one or more table 124, facilitating flexibility for each of the plurality of subsystems 108 for new test configurations. The table top 126 of the one or more table 124 may have a length of 2.4 m and a width of 1.2 m. In certain embodiments, the one or more table 124 is one or more optical table.

One or more cable rack 136 may hold a plurality of cables 140 for each of the plurality of subsystems 108. The plurality of cables 140 may include, for example, IF/RF cables, power cables, and/or control cables.

The plurality of subsystems 108 may include a first subsystem 108a, a second subsystem 108b, and a third subsystem 108c. As illustrated in FIGS. 1A-1C, the first subsystem 108a, the second subsystem 108b, and the third subsystem 108c are defined based on their functions and control configurations. Each of the plurality of subsystems 108 may include one or more rotary table 144 and one or more linear positioner 148. In this example, the first subsystem 108a is provided with a rotary table 144a, the second subsystem 108b is provided with two rotary tables 144b and 144c, and the third subsystem 108c is provided with one rotary table 144d. The first subsystem 108a is also provided with two linear positioners 148a and 148b; the second subsystem 108b is provided with two linear positioners 148c and 148d; and the third subsystem 108c is provided with one linear positioner 148e. The first subsystem 108a and the second subsystem 108b may also be provided with one or more probe antenna 152, and one or more frequency extender 156. The probe antennas 152 are denoted with the reference numerals 152a and 152b. The frequency extenders are denoted with the reference numerals 156a and 156b.

Figure 10A:
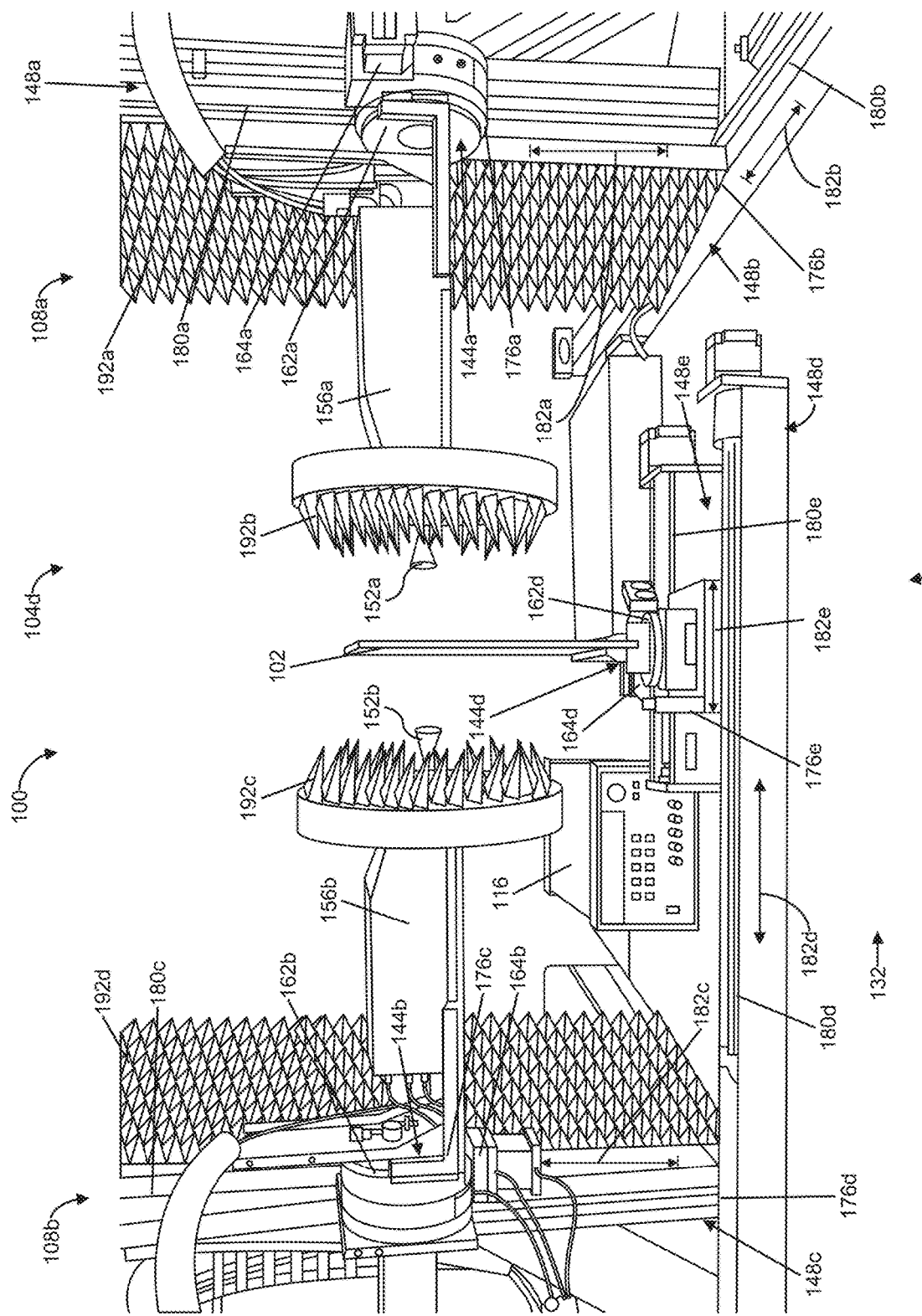
FIG. 10A is a perspective view of the multipurpose mmWave RF scanner configured for the material test mode.

As shown in FIG. 10A, each of the one or more rotary table 144 may be provided with a rotation surface 162 and a rotating motor 164 configured to rotate the rotation surface 162 about a rotation axis 168 (see FIG. 1A). The rotation axis 168 of each of the one or more rotary table 144 may be aligned with a first axis 172a (see FIG. 10B) or a second axis 172b (see FIG. 10B). In certain embodiments, the first axis 172a is the z-axis and/or the second axis 172b is the y-axis. The rotation surfaces 162 are denoted with the reference numerals 162a, 162b, 162c, and 162d. The rotating motors 164 are denoted with the reference numerals 164a, 164b, 164c, and 164d. The rotation axes 168 are denoted with the reference numerals 168a, 168b, 168c, and 168d.

Each of the one or more linear positioner 148 may be provided with a rail 180 (see FIG. 1A) and a carriage 176 disposed on the rail 180. Each of the one or more linear positioner 148 may be configured to move and fix the carriage 176 in a selected position linearly along the rail 180. The rail 180 of each of the one or more linear positioner 148 may be aligned with the first axis 172a, the second axis 172b, or a third axis 172c. In certain embodiments, the third axis 172c is the x-axis. The carriages 176 are denoted with the reference numerals 176a, 176b, 176c, 176d, and 176e. The rails 180 are denoted with the reference numerals 180a, 180b, 180c, 180d, and 180e.

The first subsystem 108a may be arranged in an inverted "T" configuration (i.e., an inverted tower and rail), thereby promoting accuracy, rigidity, and RF multi-path mitigation. The first subsystem 108a may include a first rotary table 144a, a first linear positioner 148a, and a second linear positioner 148b.

The rotation axis 168a of the first rotary table 144a may be aligned with the first axis 172a. The first frequency extender 156a may be attached to the rotation surface 162a of the first rotary table 144a, and a first probe antenna 152a may be attached to the first frequency extender 156a. The rotating motor 164a of the first rotary table 144a may be configured to enable polarization rotation (e.g., 0-360°) of the first frequency extender 156a and the first probe antenna 152a about the first axis 172a.

The rail 180a of the first linear positioner 148a may have a longitudinal axis 182a aligned with the second axis 172b. The first rotary table 144a may be moved upwardly and downwardly on the carriage 176a of the first linear positioner 148a such that the first linear positioner 148a may move and fix the first rotary table 144a in a selected position along the second axis 172b.

The rail 180b of the second linear positioner 148b may have a longitudinal axis 182b aligned with the third axis 172c for moving the carriage 176b along the third axis 172c. The first linear positioner 148a may be disposed vertically on the carriage 176b of the second linear positioner 148b such that the second linear positioner 148b may move and fix the first linear positioner 148a in a selected position along the third axis 172c. The second linear positioner 148b may be disposed horizontally on a support surface 132 of the one or more table 124. In certain embodiments, the support surface 132 is a first support surface 132a. In certain embodiments, the second linear positioner 148b may enable travel in the third axis 172c of about 0.5 m.

The first linear positioner 148a and the second linear positioner 148b may enable fixed positioning of the first probe antenna 152a in the second axis 172b and the third axis 172c in the far-field planar antenna test mode 104c, the material test mode 104d, and the radome test mode 104e, and may define an arbitrary position for the near-field planar antenna test mode 104a or the active array calibration test mode 104b.

The second subsystem 108b may include a second rotary table 144b, a third rotary table 144c, a third linear positioner 148c, and a fourth linear positioner 148d. When the RF scanner system 100 is in the material test mode 104d or the radome test mode 104e, a second frequency extender 156b may be attached to the rotation surface 162b of the second rotary table 144b, and a second probe antenna 152b may be attached to the second frequency extender 156b. When the RF scanner system 100 is in the near-field planar antenna test mode 104a or the active array calibration test mode 104b, the test device 102 may be attached to the second frequency extender 156b. When the system is in the far-field planar antenna test mode 104c, the second frequency extender 156b may be attached to the third rotary table 144c, and the test device 102 may be attached to the second frequency extender 156b.

When the RF scanner system 100 is in the near-field planar antenna test mode 104a, the active array calibration test mode 104b, or the far-field planar antenna test mode 104c, the test device 102 may be connected directly to the second frequency extender 156b using a straight WR-10 waveguide 254, or using a 1 mm coaxial cable with a WR-10-to-1-mm coaxial cable transition.

In certain embodiments, the first frequency extender 156a and the second frequency extender 156b are Copper Mountain Technologies (also referred to as "CMT") CobaltFx two-port frequency extenders (FEV-10), which are capable of operating in the frequency range of about 75 GHz to about 110 GHz. In certain embodiments, the first probe antenna 152a and the second probe antenna 152b are near-field open wave-guide RF probes (MVGWR10) with a gain of 6.5 dBi, operating from about 75 GHz to about 110 GHz.

The rotation axis 168b of the second rotary table 144b may be aligned with the first axis 172a. The rotating motor 164b of the second rotary table 144b may be configured to enable polarization rotation (e.g., 0-360°) of the second frequency extender 156b and the second probe antenna 152b (or the test device 102) about the first axis 172a.

The rotation axis 168c of the third rotary table 144c may be aligned with the third axis 172c. The rotating motor 164c of the third rotary table 144c may be configured to enable rotation (e.g., 0-360°) of the second frequency extender 156b and the test device 102 about the third axis 172c. The third rotary table 144c may be disposed vertically on a support arm 184. In certain embodiments, the support arm 184 is shaped like an "L".

The rail 180c of the third linear positioner 148c may have a longitudinal axis 182c aligned with the second axis 172b. The second rotary table 144b may be moved upwardly and downwardly, and disposed horizontally on the carriage 176c of the third linear positioner 148c, and the support arm 184 may be attached to the carriage 176c of the third linear positioner 148c opposite the second rotary table 144b such that the third linear positioner 148c may move and fix the second rotary table 144b and the third rotary table 144c in a selected position along the second axis 172b.

The rail 180d of the fourth linear positioner 148d may have a longitudinal axis 182d aligned with the first axis 172a. The third linear positioner 148c may be disposed vertically on the carriage 176d of the fourth linear positioner 148d such that the fourth linear positioner 148d may move and fix the third linear positioner 148c in a selected position along the first axis 172a. In certain embodiments, the fourth linear positioner 148d is disposed horizontally on the support surface 132; however, in other embodiments, the fourth linear positioner 148d is disposed horizontally on a second support surface 132b of the one or more table 124.

The third linear positioner 148c and the fourth linear positioner 148d may enable fixed positioning of the second probe antenna 152b (or the test device 102) in the second axis 172b and the third axis 172c in the far-field planar antenna test mode 104c, the material test mode 104d, and the radome test mode 104e, and may define an arbitrary position for the near-field planar antenna test mode 104a or the active array calibration test mode 104b. Polarization rotation of the second probe antenna 152b (or the test device 102) attached to the second rotary table 144b may be used in the near-field planar antenna test mode 104a, the active array calibration test mode 104b, the material test mode 104d, and the radome test mode 104e. Rotation of the test device 102 attached to the third rotary table 144c may be used in the far-field planar antenna test mode 104c.

The third subsystem 108c may be used exclusively for the material test mode 104d and the radome test mode 104e. The third subsystem 108c may include a fourth rotary table 144d and a fifth linear positioner 148e. A material support 188 may be attached to the fourth rotary table 144d. The material support 188 may be configured to secure in place the test device 102.

The rotation axis 168d of the fourth rotary table 144d may be aligned with the second axis 172b. The fourth rotary table 144d may enable rotation (e.g., 0-360) of the material support 188 about the second axis 172b The rail 180e of the fifth linear positioner 148e may have a longitudinal axis 182e aligned with the third axis 172c. The fourth rotary table 144d may be disposed vertically on the carriage 176e of the fifth linear positioner 148e such that the fifth linear positioner 148e may move and fix the fourth rotary table 144d in a selected position along the first axis 172a. The fifth linear positioner 148e may be disposed horizontally on the fourth linear positioner 148d such that the fourth linear positioner 148d may move and fix the fifth linear positioner 148e in a selected position along the first axis 172a.

Each of the one or more linear positioner 148 may have a load capacity of about 300 lbs. (136 kg) horizontally and about 100 lbs. (45.4 kg) vertically, a straight-line accuracy of about 0.003 inch (0.076 mm) ($\lambda$/36 at 110 GHz) over the entire travel distance, and a repeatability of about 0.0002 inch (0.005 mm). Each of the one or more rotary table 144 may have an accuracy of about 100 arc-sec and a repeatability of about 1 arc-sec (1/3600 of 1°).

Two sets of antennas (two lens-corrected and one open-ended wave-guide probe) are used for the near-field planar antenna test mode 104a, the far-field planar antenna test mode 104c, the material test mode 104d, and the radome test mode 104e.

One or more RF absorber 192 may be used to cover and minimize reflections from metallic parts of the first subsystem 108a and the second subsystem 108b. In certain embodiments, the one or more RF absorber 192 is one or more high-performance broadband RF absorber (e.g., Cuming's C-RAM SFC3) made from low-density polyurethane. The one or more RF absorber 192 may be rated to have a reflectivity of about −50 dB at a normal incident angle and about −35 dB at a 45° incident angle. The one or more RF absorber is denoted with the reference numerals 192a, 192b, 192c, 192d, 192e, and 192f.

In certain embodiments, the plurality of controllers 112 include first controllers 112a configured to control the one or more linear positioner 148 and second controllers 112b configured to control the one or more rotary table 144; however, in other embodiments, the plurality of controllers 112 include the first controllers 112a configured to control the first subsystem 108a, the second controllers 112b configured to control the second subsystem 108b, and third controllers 112c configured to control the third subsystem 108c. In the example shown in FIG. 1A, the first controllers 112a are configured to control the linear positioners 148a, 148b, and the rotary table 144a to position the first probe antenna 152a at a desired location and/or orientation. The second controllers 112b are configured to control the linear positioners 148c, 148d, and the rotary tables 144b, 144c, to position the test device 102 (in this instance, a test antenna) at a desired location and/or orientation. The third controllers 112c are configured to control the fifth linear positioner 148e and the fourth rotary table 144d to position the material support 188 at a desired location and/or orientation.

The vector network analyzer 116 may be provided with a first port to receive first signals from the first frequency extender 156a and a second port to receive second signals from the second frequency extender 156b. In certain embodiments, the vector network analyzer 116 is a CMT two-port vector network analyzer (C4209). The vector network analyzer 116 may be capable of operating in the frequency range of about 100 kHz to about 9 GHz and measuring at a speed of about 10 μsec per point. The vector network analyzer 116 may have a dynamic range of about 110 dB.

Figure 12:
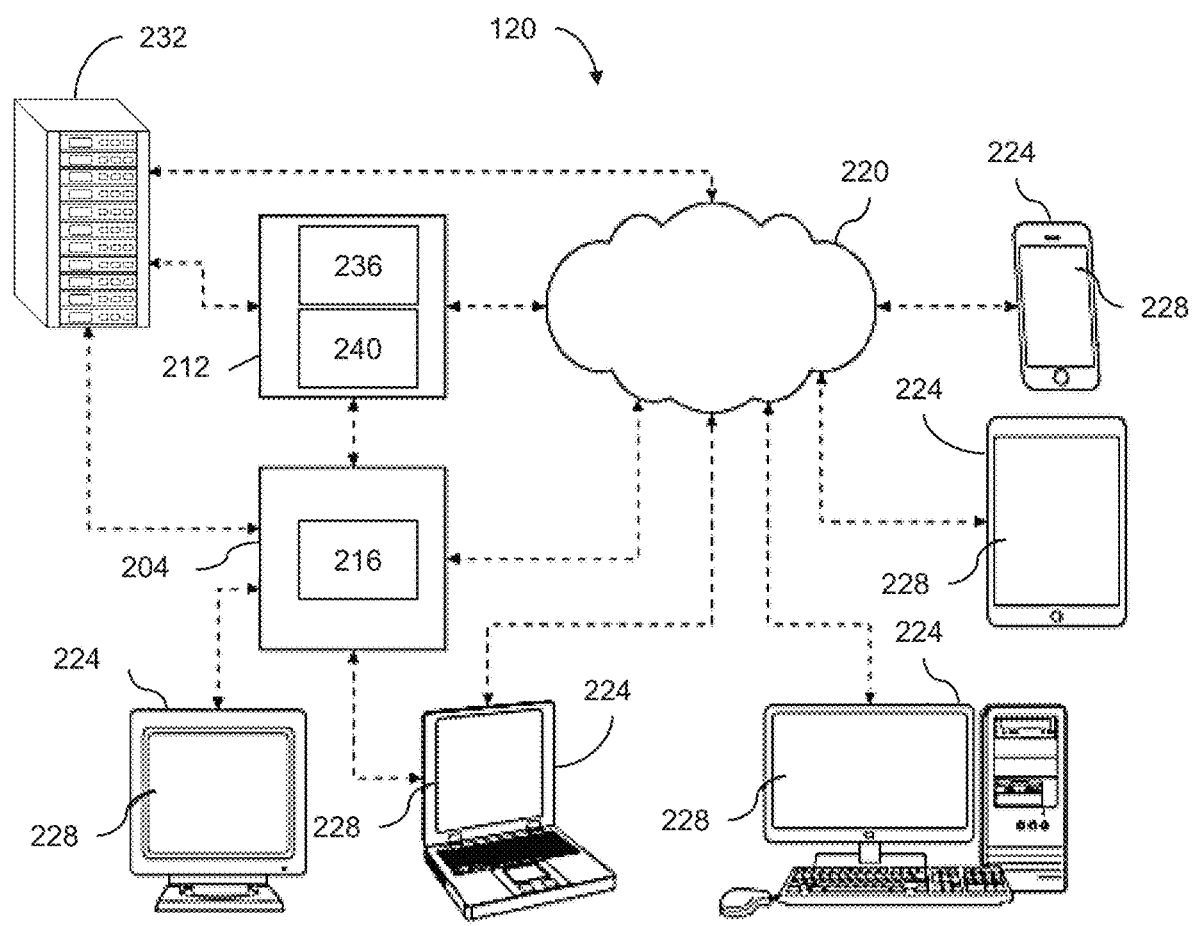
FIG. 12 shows an exemplary embodiment of a computer system included in the RF scanner system.

In certain embodiments, the vector network analyzer 116 may communicate with the one or more computer system 120. The one or more computer system 120 may comprise one or more processor 204 and one or more non-transitory memory 212. As shown in FIG. 12, the one or more processor 204 may include (or be communicatively coupled with) one or more communication component 216. The one or more non-transitory memory 212 may store data indicative of orientations of the one or more rotary tables 144, positions of the one or more linear positioners 148, measured results of the test device 102, and/or the like in one or more database 236. The one or more computer system 120 may include a network 220 enabling bidirectional communication between the one or more processor 204 and the one or more non-transitory memory 212 with one or more user device 224. The one or more user device 224 may communicate via the network 220 and/or may display information on a screen 228. The one or more processor 204, the one or more non-transitory memory 212, and the screen 228 may or may not necessarily be located in a single physical location.

In certain embodiments, the network 220 is the Internet and the one or more user device 224 interface with the one or more processor 204 via the one or more communication component 216 using a series of web pages. It should be noted, however, that the network 220 may be almost any type of network and may be implemented as the World Wide Web (or Internet), a local area network (LAN), a wide area network (WAN), a metropolitan network, a wireless network, a cellular network, a Global System for Mobile Communications (GSM) network, a code division multiple access (CDMA) network, a 3G network, a 4G network, a 5G network, a satellite network, a radio network, an optical network, a cable network, a public switched telephone network, an Ethernet network, combinations thereof, and/or the like. It is conceivable that in the near future, embodiments of the present disclosure may use more advanced networking topologies.

In certain embodiments, the one or more processor 204 and the one or more non-transitory memory 212 are implemented with a server system 232 having multiple servers in a configuration suitable to provide a commercial computer-based business system such as a commercial website and/or data center. An exemplary embodiment of the computer system 120 is shown in FIG. 12.

The one or more non-transitory memory 212 may also store one or more processor executable instruction 240 or a software application. The computer system 120 may include a web browser and/or a native software application running on the computer system 120 and configured to communicate with the plurality of controllers 112 and/or the vector network analyzer 116 over the network 220. The one or more processor executable instruction 240 may be configured to access a website and/or communicate information and/or data with the vector network analyzer 116 over the network 220. In certain embodiments, the computer system 120 may include an application program (e.g., a specialized program downloaded onto the computer system 120) and communicate with the plurality of controllers 112 and/or the vector network analyzer 116 via the network 220 through the application program. In certain embodiments, the computer system 120 may receive one or more notification from the vector network analyzer 116.

The or more processor executable instruction 240 may include a control software application configured to operate the RF scanner system 100 autonomously, permit selection of each of the operating modes 104, and accurately perform in each of the plurality of operating modes 104, facilitate user-friendly operation of the RF scanner system 100, and guarantee repeatable and reliable measurements of the test device 102. In certain embodiments, the control software application is implemented in National Instruments' LabVIEW. Operation of the RF scanner system 100 may include integration of the first probe antenna 152a and the second probe antenna 152b, the plurality of controllers 112a-c, the vector network analyzer 116, the first frequency extender 156a and the second frequency extender 156b, and one or more post-processing algorithm for each of the plurality of operating modes 104. The one or more post-processing algorithm may include a fast Fourier transform (also referred to as "FFT") algorithm, a phase retrieval algorithm, a probe correction algorithm, and/or a holographic projection algorithm. In certain embodiments, the one or more post-processing algorithm may be one or more subroutine implemented in MathWorks' MATLAB.

In some embodiments, the RF scanner system 100 includes a graphical user interface (also referred to as "GUI") 208 (see FIG. 1A) configured to be displayed on the screen 228 of the one or more user device 224. The graphical user interface 208 may include a plurality of control modes for manual operation and maintenance of the RF scanner system 100 in each of the plurality of operating modes 104. FIG. 1D illustrates one embodiment of the graphical user interface 208 for the near-field planar antenna test mode 104a and its main features.

Figure 4A:
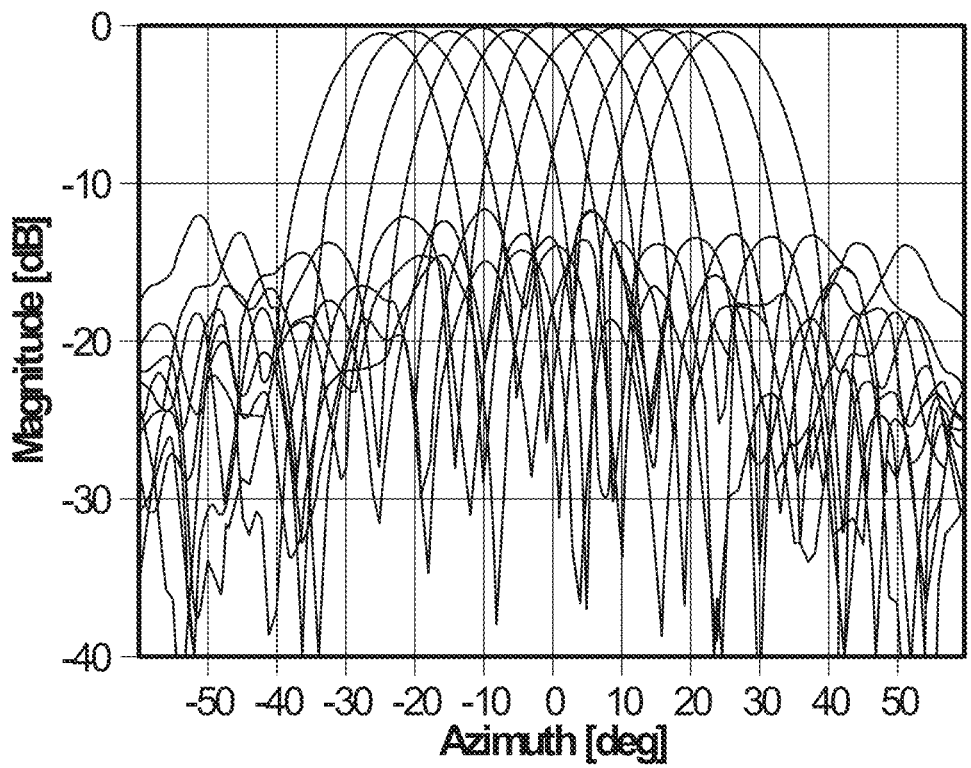
FIG. 4A shows measured radiation patterns of an active array of 6×8 elements at 77 GHz with eight analog phase shifters. The active array was characterized in near-field planar antenna test mode, and e-scanned antenna patterns in H-plane were obtained in far-field planar antenna test mode from −25° to 25° in steps of 5°.

In order to validate the RF scanner system 100, show its features, and describe how each of the plurality of operating modes 104 works, the RF scanner system 100 may be used to measure the test device 102 in each of the plurality of operating modes 104. In one example, to validate the near-field planar antenna test mode 104a and the far-field planar antenna test mode 104c, the test device 102 was a spherical uniform dielectric lens antenna designed to operate at about 77 GHz. Shown in FIG. 4C is a block diagram of an exemplary test device 102. To validate the active array calibration test mode 104b, the test device 102 was an active array antenna of 6×8 elements 242 (shown in FIG. 4C) at 77 GHz with eight analog phase shifters 244 (shown in FIG. 4C) and a beam controller 246 including a transmit-and-receive module 248 for power and gain. To validate the radome test mode 104e, the test device 102 was a single-layer radome designed and fabricated for such purpose. To validate the material test mode 104d, the test device 102 was two different RF materials commonly used in the microwave region, namely Rogers 4350B and Rogers 5880.

Near-Field Planar Antenna Test Mode (NFTM).

Although the far-field radiation pattern of an antenna may be measured directly and is relatively easy to implement, the distance required between the first probe antenna 152a (connected to the first frequency extender 156a and supported by the first subsystem 108a) and the test device 102 (connected to the second frequency extender 156b and supported by the second subsystem 108b) limits its use in cases of electrically large antennas. To overcome this limitation, one may measure the near-field radiation pattern of the antenna and apply a mathematical transformation as part of the one or more post-processing algorithm. However, this method demands that linear positioners are accurate, making linear positioners more complicated to implement and requiring the use of the one or more post-processing algorithm. The ability to test the test device 102 with a small separation between the test device 102 and the first probe antenna 152a (e.g., 3A to 5A) permits measurement of the test device 102 in small spaces, thus allowing the RF scanner system 100 to be enclosed in a climate- and electromagnetically-controlled environment.

Operation of the near-field planar antenna test mode 104a requires the acquisition and processing of two complex (substantially) orthogonal polarization components, ensuring that co-polar and cross-polar far-field radiation pattern data can be recovered. The near-field radiation pattern data is then converted into far-field radiation pattern data within a specific coordinate system using the analytical Fourier transform and the specific polarization definition.

Generally, for high-accuracy near-field planar measurements, the spacing interval required in the x-axis and the y-axis is $\lambda/2$, while the positional accuracy is specified as being smaller than $\lambda/30$. At 100 GHz, the plurality of linear positioners 148 may provide a positional accuracy of $\lambda/36$. In the near-field planar antenna test mode 104a, a maximum planar near-field raster scanner window of 0.5 m×0.5 m in the x-y plane is defined by a maximum scanning range of the first subsystem 108a, the test device 102 position and size, and the maximum scanning range defined by the user. The distance from the test device 102 to the first probe antenna 152a, typically defined from $3\lambda$ to $5\lambda$, can be adjusted using the fourth linear positioner 148d of the second subsystem 108b.

The near-field planar antenna test mode 104a may be fully automated using the computer system 120 to run the one or more processor executable instruction 240. As illustrated in FIG. 1D, the graphical user interface 208 enables the user to enter dimensions and positions for the test device 102, a distance between the test device 102 and the first probe antenna 152a, a maximum far-field scanning angle, a center frequency, and dimensions for the scanning window. The one or more processor executable instruction 240 may include software that, when executed by the processor 204, automatically generates a scanning window and grid as a function of the size, maximum far-field scanning angle, and frequency of the test device 102, and the distance between the test device 102 and the first probe antenna 152a. Once setup is ready, such software may estimate the number of points required and initialize a test using a raster scan in the x-y plane. The raster scan may be set by the user to scan in rows or columns.

After the test is completed, the one or more post-processing algorithm may transform the measured near-field radiation pattern data into far-field radiation pattern data using the analytical Fourier transform. In the near-field planar antenna test mode 104a, the vector network analyzer 116 records the magnitude and phase of tangential electric field components radiated by the test device 102 for each point in the previously defined scanning window and grid. Using the modal expansion method, for example, the sampled near-field radiation pattern data is used to determine the amplitude and phase of an angular spectrum of plane waves. Determination of the total electric fields, in terms of modal expansion, allows calculation of the fields at any distance from the antennas. For far-field radiation patterns, the electric fields are calculated at an infinite distance.

FIG. 1B provides additional details of the hardware and control configuration for the near-field planar antenna test mode 104a. TABLE 1 and TABLE 2 provide additional specifications for the near-field planar antenna test mode 104a.

NFTM Validation.

Figure 2:
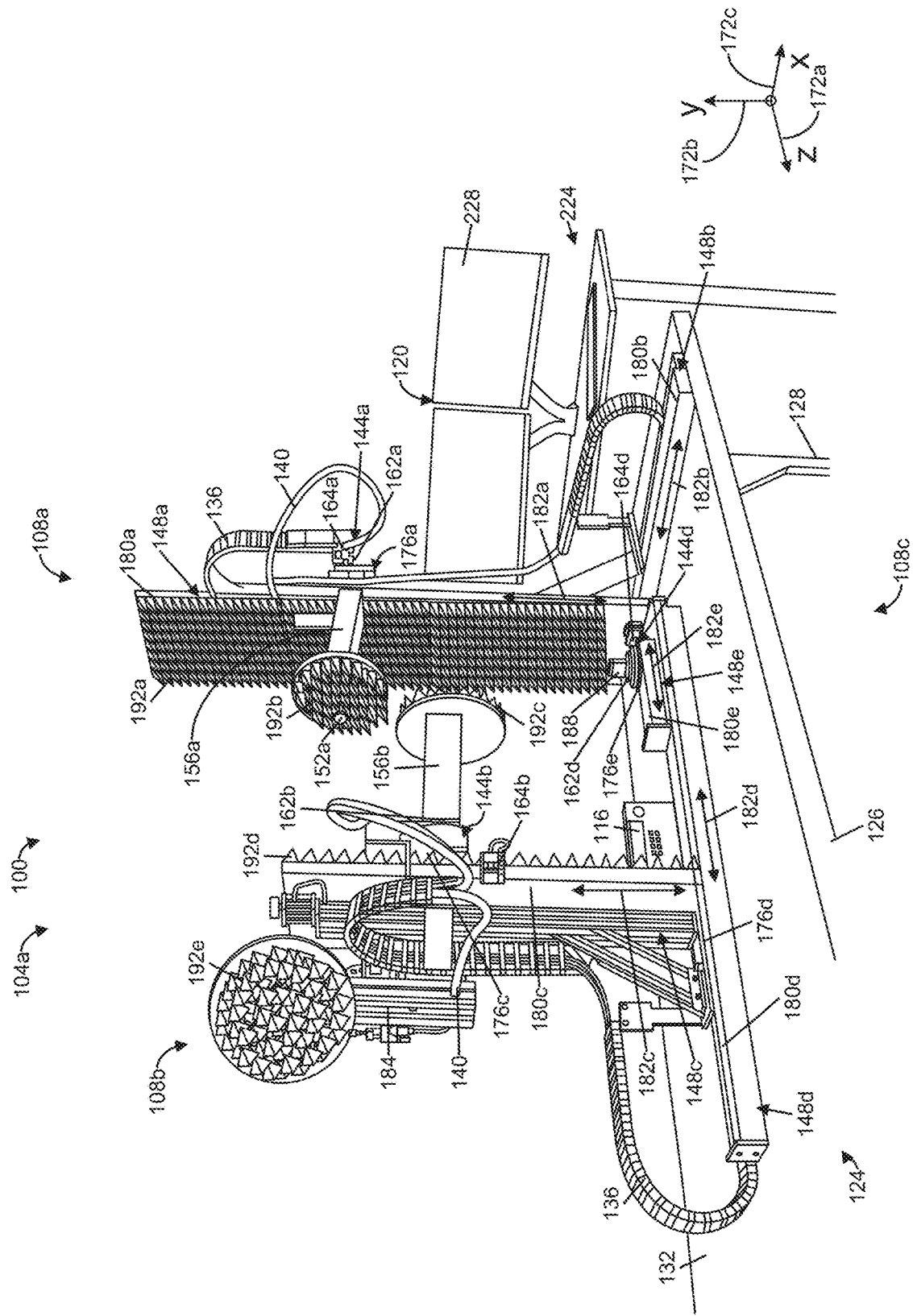
FIG. 2 is a perspective view of the exemplary multipurpose mmWave RF scanner of the present disclosure configured for near-field planar measurement of a uniform dielectric lens antenna designed to operate at 77 GHz.
Figure 6A:
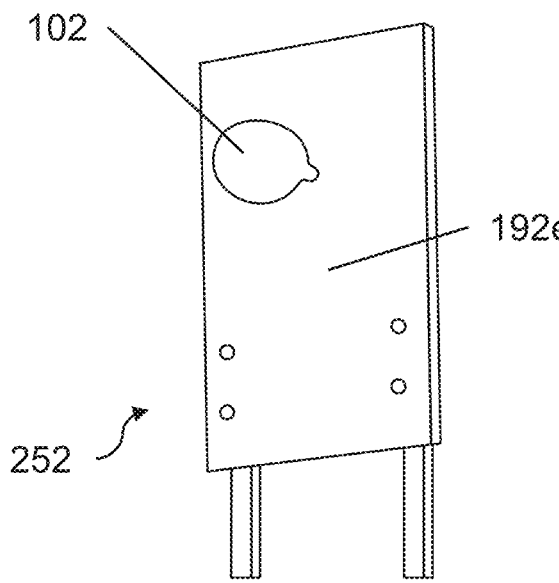
FIG. 6A is a perspective view of a 77 GHz spherical lens antenna used as a test device in the far-field planar antenna test mode.
Figure 6B:
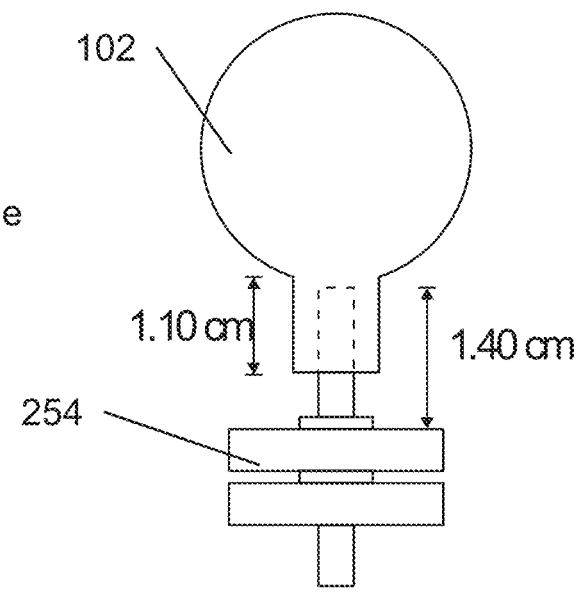
FIG. 6B is a graphical representation of the spherical lens antenna shown in FIG. 6A connected to a WR-10 waveguide used as a feed.

To validate the near-field planar antenna test mode 104a, the test device 102 (in this instance, a test antenna) was designed using Ansys HFSS to operate at the center frequency of 77 GHz. Form 3 3D printing using the stereolithography (also referred to as "SLA") method was used to fabricate an antenna with a radius of 22.9 mm. Form 3 3D printing has a resolution of 25 µm and uses photopolymer resin (V4) material. A cylindrical shape was added to support the antenna with the open-ended waveguide probe used to excite the lens antenna. FIG. 2 illustrates the system configured for the near-field planar antenna test mode 104a. FIGS. 6A and 6B show the test device 102 and a fixture 252 supporting the test device 102 used for validation.

Figure 3A:
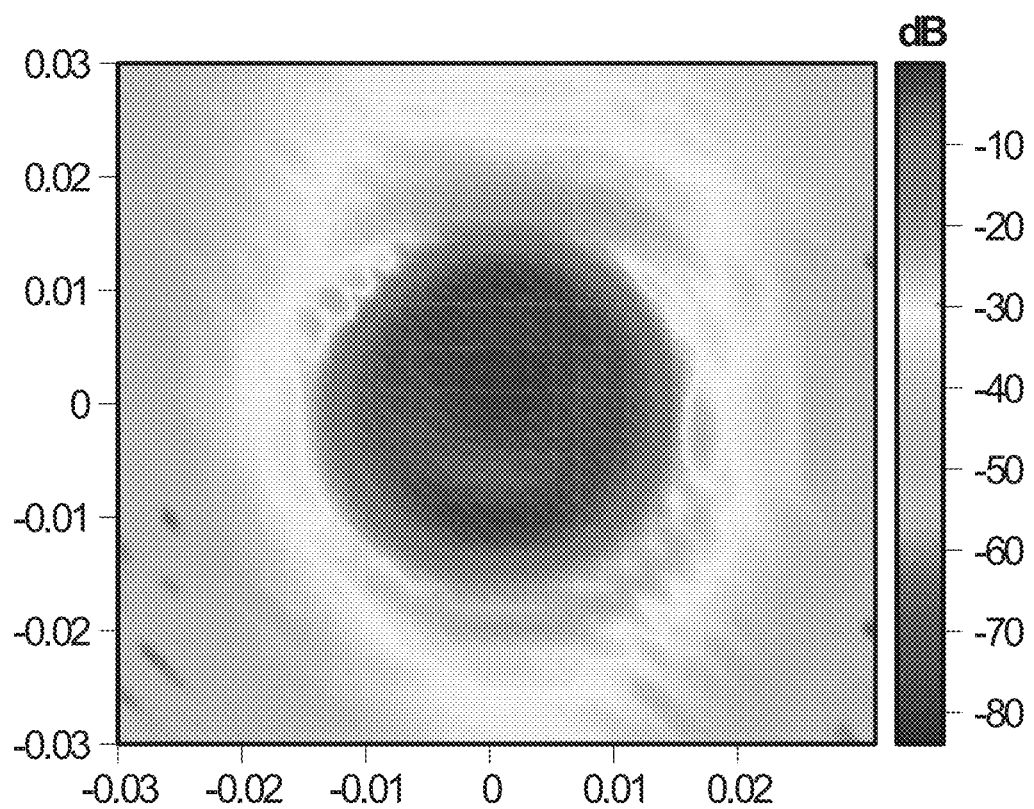
FIG. 3A shows a measured radiation pattern of a uniform dielectric lens antenna at 77 GHz tested in the near-field planar mode, showing the magnitude of antenna patterns in the near-field region.
Figure 3B:
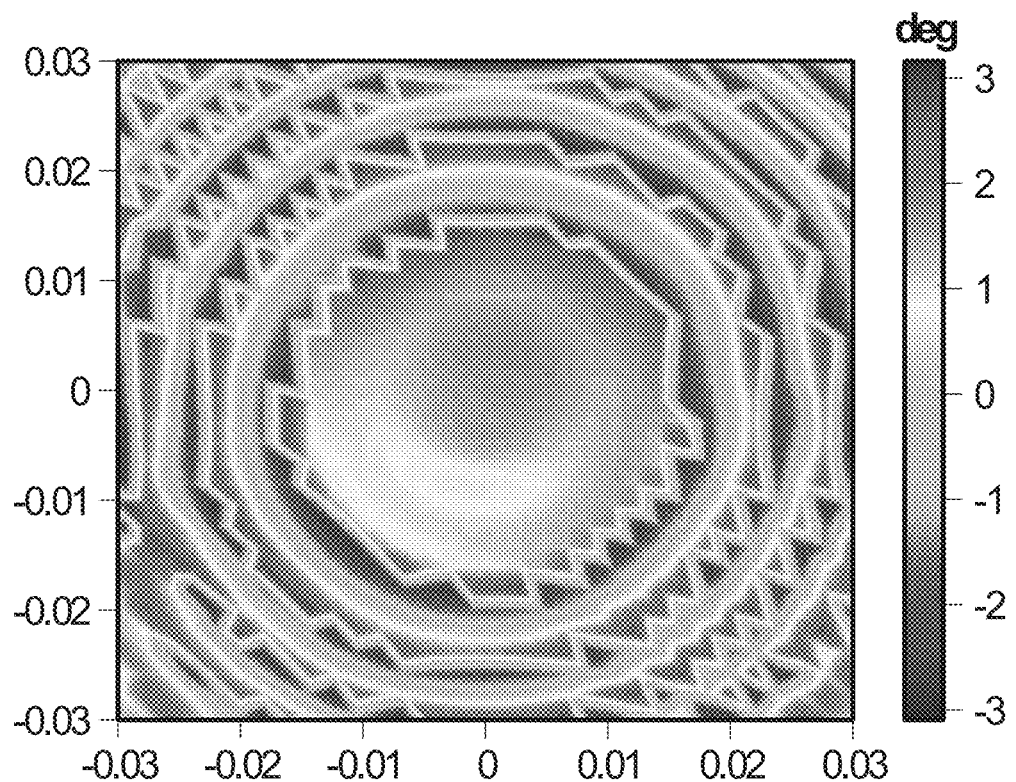
FIG. 3B shows a measured radiation pattern of a uniform dielectric lens antenna at 77 GHz tested in the near-field planar mode, showing the phase of antenna patterns in the near-field region.
Figure 3C:
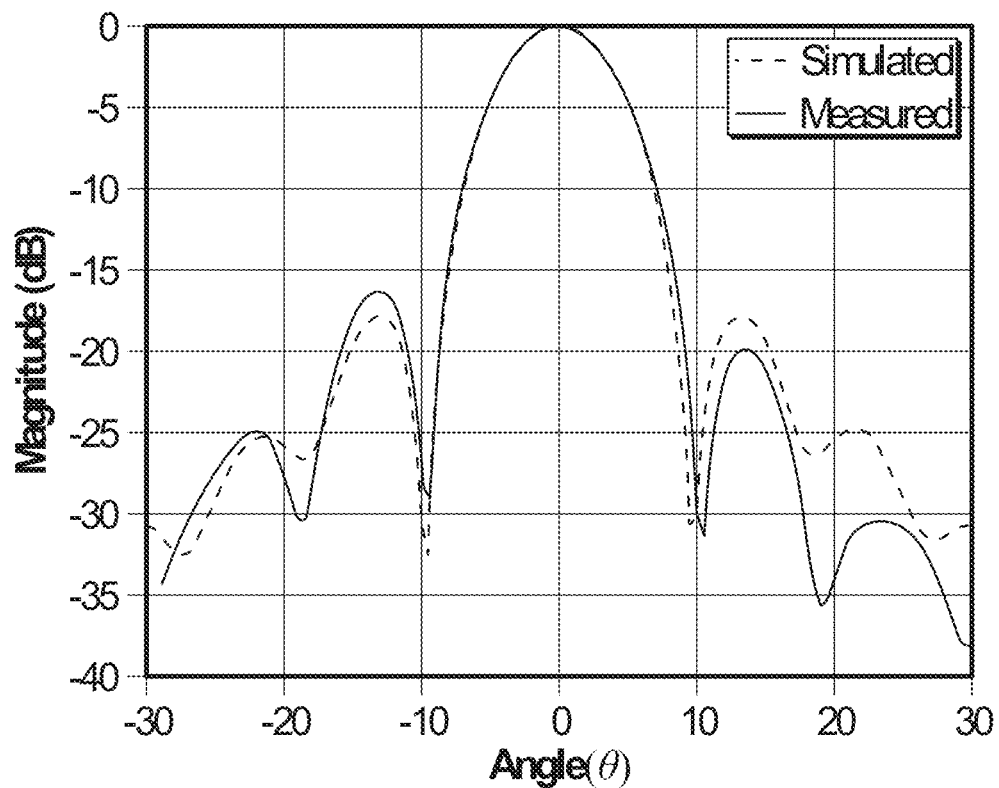
FIG. 3C shows a measured radiation pattern of a uniform dielectric lens antenna at 77 GHz tested in the near-field planar mode, showing overlapped simulated and measured antenna patterns in the azimuth plane.
Figure 3D:
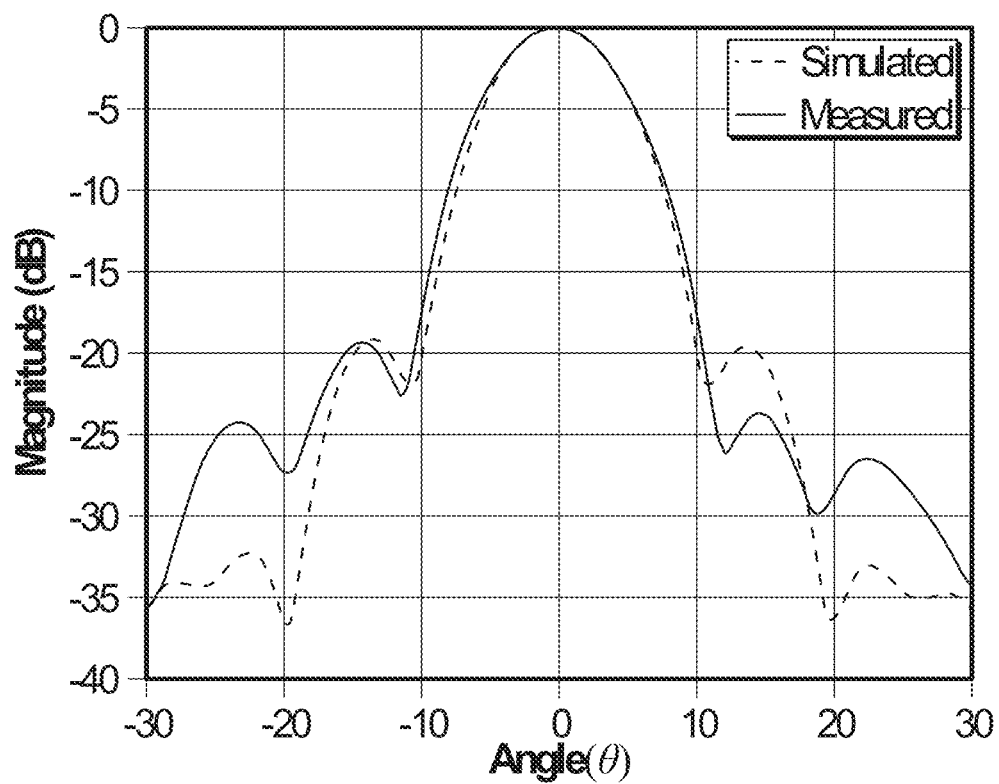
FIG. 3D shows a measured radiation pattern of a uniform dielectric lens antenna at 77 GHz tested in the near-field planar mode, showing overlapped simulated and measured antenna patterns in the elevation plane.

For the near-field planar antenna test mode 104a, 4A was used as a distance between the probe antenna 152a (in the first frequency extender 156a) and the test device 102. This distance enables a 30° field of view with a scan window of 30 mm×30 mm. FIGS. 3A-3B present measured results of the magnitude and phase of the 2D far-field radiation patterns. FIGS. 3C-3D show cuts of the far-field radiation patterns in azimuth and elevation overlapped with simulated results obtained using Ansys HFSS. In both cases (measured and simulated), the compared results are in good correspondence with a field of view of +10°.

Active Array Calibration Test Mode (ACTM).

The near-field planar antenna test mode 104a (in a planar configuration) is commonly used to calibrate active array antennas. In the near-field region, the procedure for calibration comprises characterization of the power of each element 242 of the test device 102 (in this instance, a test antenna, particularly an active array). The elements 242 are denoted in FIG. 4C with the reference numerals 242-11 to 242-86 for purposes of clarity. This procedure is well-known as a park-and-probe near-field test and requires precise positioning of the first probe antenna 152a in front of the center of each element 242 of the test device 102. Once the amplitude and phase of the near-field power of each element 242 of the test device 102 is characterized, the one or more post-processing algorithm may be used to adjust the amplitude and phase to achieve the desired beam position and shape of the test device 102. This procedure requires near-field planar scanning and software capable of performing a raster scan with spacing intervals dictated by the position of the elements 242.

The active array calibration test mode 104b may include a subroutine in which the one or more computer system 120 interfaces with a beam controller 246 of the test device 102 to synchronize the scanner with the vector network analyzer 116, polarization mode, transmit or receive mode, and any possible combination of phase shifter and attenuator state the user may require. For this particular validation, the beam controller 246 enables access to each of the analog phase shifters 244 available in the active array. The analog phase shifters 244 are denoted in FIG. 4C with the reference numerals 244-1 to 244-8 for purposes of clarity. The validation test was performed for V-polarization in the H-plane and for receive mode.

FIG. 1A shows the configuration of the RF scanner system 100 for the active array calibration test mode 104b. Even though the hardware configuration is the same used in the near-field planar antenna test mode 104a, the one or more processor executable instruction 240 and the graphical user interface 208 are different. TABLE 1 describes the generic specifications for the active array calibration test mode 104b.

ACTM Validation.

A graphical representation of the experimental near-field configuration is shown in FIG. 2. The test device 102 (in this instance, a test antenna, particularly an active array) is connected to the second frequency extender 156b using a 1 mm coaxial cable with a WR-10-to-1-mm coaxial cable transition. The second linear positioner 148b and the fourth linear positioner 148d in the second subsystem 108b define the center of near-field planar scan in the x-y plane. The separation between the test device 102 array and the first probe antenna 152a is 3λ. Since the antenna is polarized in y-axis, Ludwig 2-II is used to obtain the co-polar patterns. The first linear positioner 148a, the second linear positioner 148b, the third linear positioner 148c, and the fourth linear positioner 148d, with an accuracy of 0.076 mm and repeatability of 0.0002 mm, enable precise sampling of electric fields in the near-field region. Each column 250 of the test device 102 acts as an active sub-array and is excited by an analog phase shifter 244; therefore, for calibration purposes, the problem was reduced to test an eight-element linear array. The columns 250 are denoted in FIG. 4C with the reference numerals 250-1 to 250-8 for purposes of clarity.

Figure 4B:
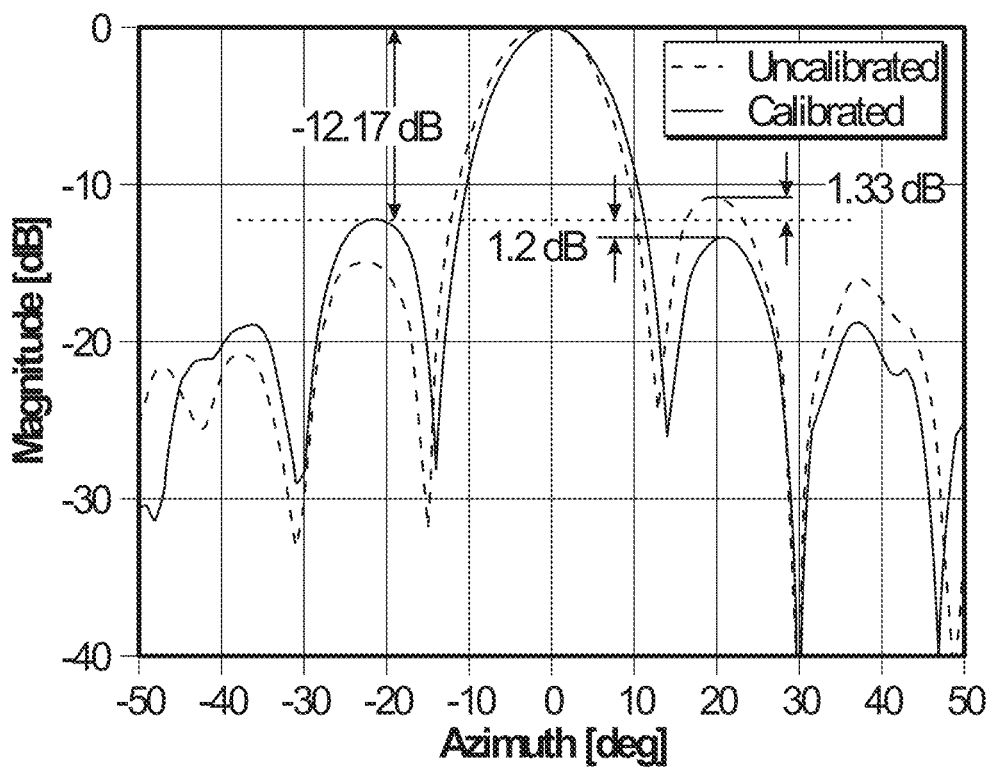
FIG. 4B shows measured radiation patterns of an active array of 6×8 elements at 77 GHz with eight analog phase shifters. The active array was characterized in near-field planar antenna test mode, and e-scanned antenna patterns in H-plane were obtained in far-field planar antenna test mode. The measured radiation patterns show a comparison between the uncalibrated and calibrated patterns at broadside measured in far-field mode.
Figure 4C:
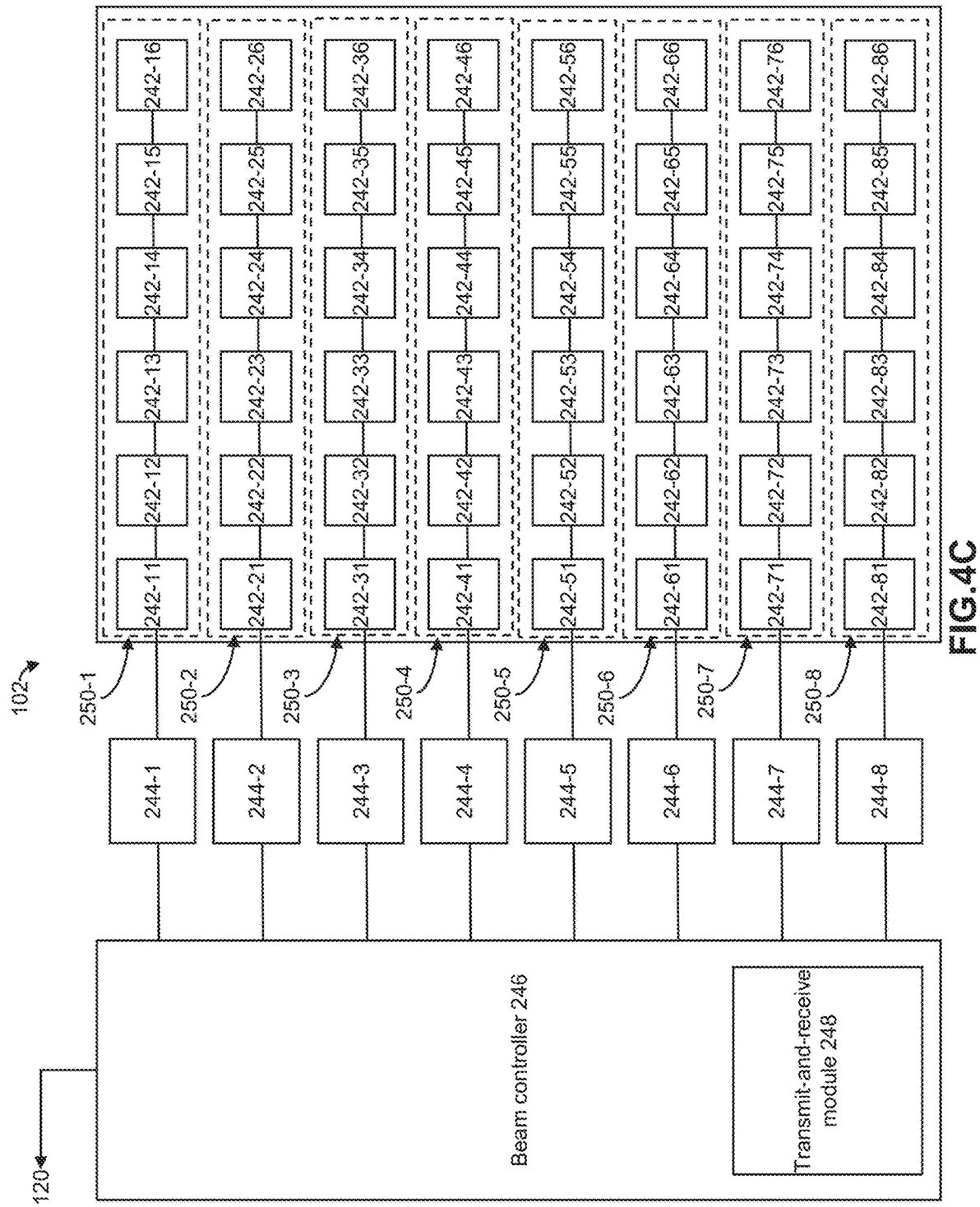
FIG. 4C is a block diagram of the active array of 6×8 elements of FIGS. 4A-4B.

FIG. 4B presents the broadside antenna patterns of the test device 102 before and after calibration. This measurement was performed using far-field mode. At broadside, a beam position error of F with 1.3 dB deviation in the first sidelobe level was observed when the array was tested before calibration. Park-and-probe characterization in the near-field planar mode was used to characterize each sub-array. Knowing the power amplitude and phase deviation needed for ideal excitation in the array for each beam position, each analog phase shifter 244 was adjusted for phased correction. Considering the test device 102 did not have attenuators to correct amplitude errors, an optimization algorithm was used to identify the optimum combination of phase shifting that takes into account small-amplitude variations to obtain a better beam pattern for uniform distribution.

FIG. 4A shows the measured results of electronically scanned patterns after the calibration process. The electronically scanned patterns, obtained in far-field mode, were obtained from −30° to +30° and produced errors less than 0.01° for each beam position in the H-plane.

Far-Field Planar Antenna Test Mode (FFTM).

The far-field planar antenna test mode 104c shown in FIG. 1B is a direct test procedure that is quite convenient for fast measurement when a single cut pattern is required. A minimum separation of the test device 102 and the first probe antenna 152a is obtained using the formula $d_{ff}=2D^2/\lambda$, where D represents the maximum dimension of the test device 102, and λ is the wavelength at the lowest frequency of the antenna operation bandwidth. For the far-field planar antenna test mode 104c, the maximum separation between the test device 102 and the first probe antenna 152a may be about 1.5 m.

As illustrated in FIG. 1B, the test device 102 may be placed on the third rotary table 144c of the second subsystem 108b. The second linear positioner 148b and the fourth linear positioner 148d may define the position of the test device 102 with respect to the first probe antenna 152a. Cross laser beams were used to align the center of rotation of the test device 102 with respect to the first probe antenna 152a. The first rotary table 144a and the third rotary table 144c may have a position accuracy of about 100 arc-sec, and repeatability of about 100 arc-sec, enabling accurate measurement of the far-field radiation pattern.

For the far-field planar antenna test mode 104c, the first probe antenna 152a may be a lens-corrected conical horn antenna that operates from about 75 GHz to about 110 GHz. The first probe antenna 152a may have a gain of about 26 dBi with a 3 dB beam-width of about 7° in the E-plane and about 9° in the H-plane. The rotating motor 164a of the first rotary table 144a provides the first frequency extender 156a and the first probe antenna 152a with full 360° polarization rotation. Parameters such as frequency range, number of frequencies, and angle step size are controlled by the graphical user interface 208. TABLE 1 summarizes the overall specifications for the far-field planar antenna test mode 104c.

FFTM Validation.

Figure 5:
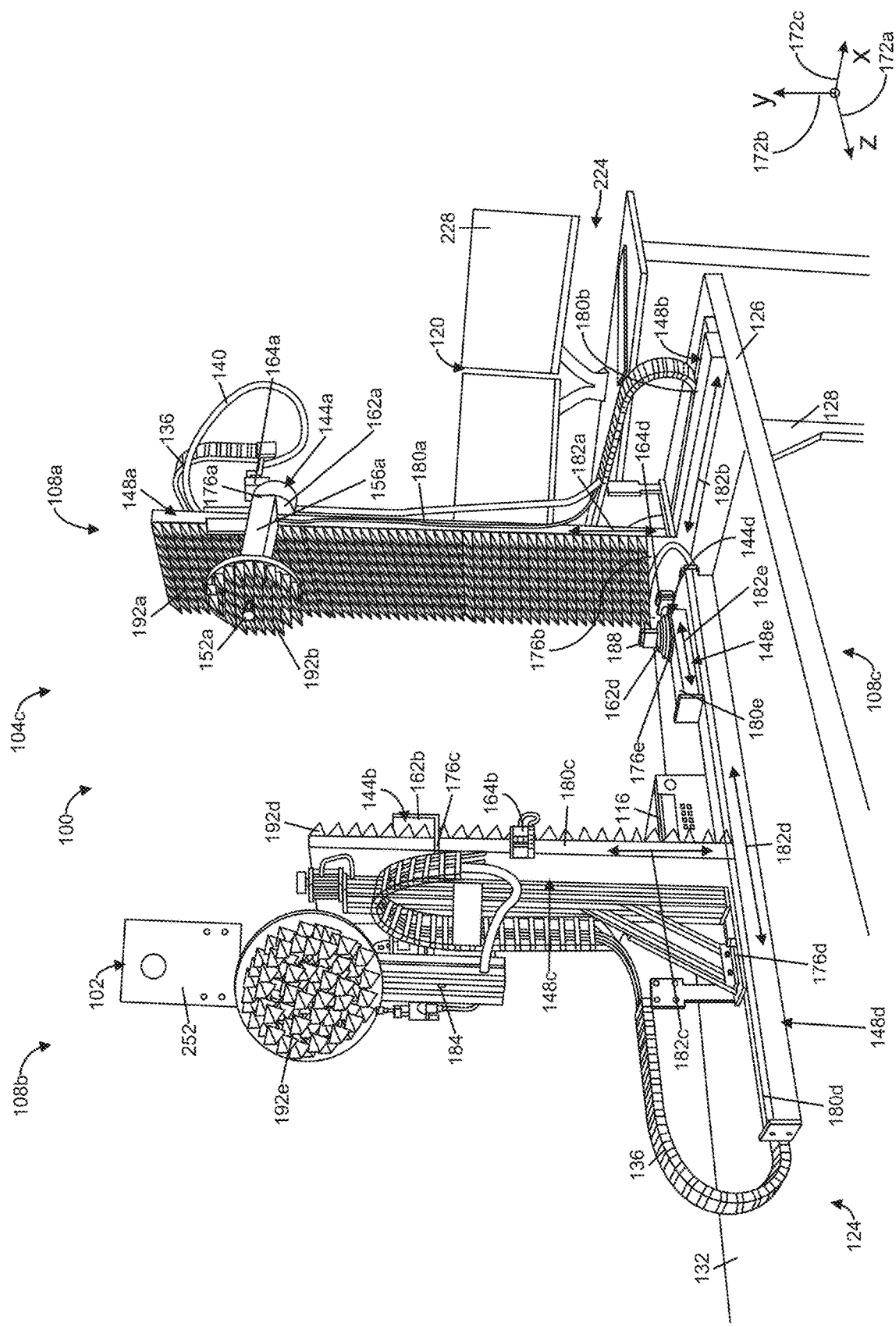
FIG. 5 is a perspective view of the exemplary multipurpose mmWave RF scanner configured for far-field test mode for measurement of a uniform dielectric lens antenna at 77 GHz.

Setup of the RF scanner system 100 for the far-field planar antenna test mode 104c is illustrated in FIG. 5. In this mode, the test device 102 is attached to the fixture 252 and mounted on top of the second frequency extender 156b. The fixture 252 may comprise a high-frequency-grade polymethacrylimide (also referred to as "PMI") foam and a thin aluminum frame. In certain embodiments, the high-frequency-grade PMI foam is Evonik's ROHACELL 51 HF. To minimize scattering fields from surrounding metallic parts, the one or more RF absorber 192 may be used to cover most metallic parts close to the test device 102. The one or more RF absorber 192 may also be used to cover metallic parts of the second subsystem 108b.

Figure 7:
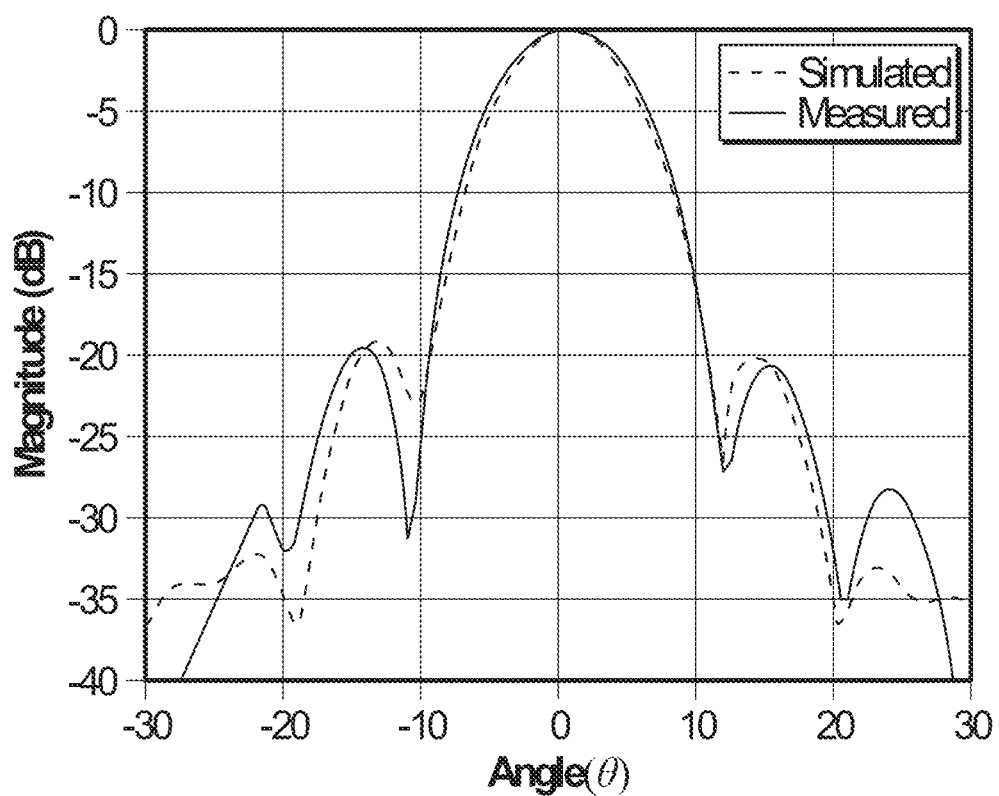
FIG. 7 shows overlapped far-field antenna radiation patterns and simulated results of the spherical lens antenna shown in FIGS. 6A and 6B in the far-field planar antenna test mode.

FIG. 7 presents a comparison of the H-plane antenna patterns of the test device 102 tested in the far-field planar antenna test mode 104c with simulated results obtained using Ansys HFSS. Good correspondence was obtained between measured and simulated results of the test device 102 in the main beam region. However, small discrepancies were found in the region after ±10°, which may be attributed to not having an enclosed room with the one or more RF absorber 192 surrounding the RF scanner system 100.

Radome Test Mode (RTM).

Characterization and testing of a radome in the mmWave region is important to guarantee overall radar or communication performance. This test requires that the RF scanner system 100 have excellent accuracy, stability, and repeatability, especially when extraction of intrinsic properties (i.e., permittivity and permeability constants) of the test device 102 is required.

In one non-limiting embodiment, a free-space focused Gaussian beam method is mostly used for mmWave applications. A focused Gaussian beam guarantees a minimum spot size in the middle of the test device 102 that is not affected by the diffracted fields at the edges of the test device 102. The RF scanner system 100 is primarily designed to extract the scattering parameters (also referred to as "S-parameters") of the test device 102. The radome test mode 104e may use the S-parameters to evaluate the overall performance of the test device 102 in the frequency and incident angle domains. The plurality of linear positioners 148 and the plurality of rotary tables 144 were used to align (in the x-axis, y-axis, and z-axis) the one or more frequency extender 156, the one or more probe antenna 152, and the test device 102.

The configuration for the radome test mode 104e is illustrated in FIG. 1C, and general specifications of the RF scanner system 100 in the radome test mode 104e and instrumentation specifications of the RF instrumentation are provided in TABLE 1 and TABLE 2, respectively.

Figure 8:
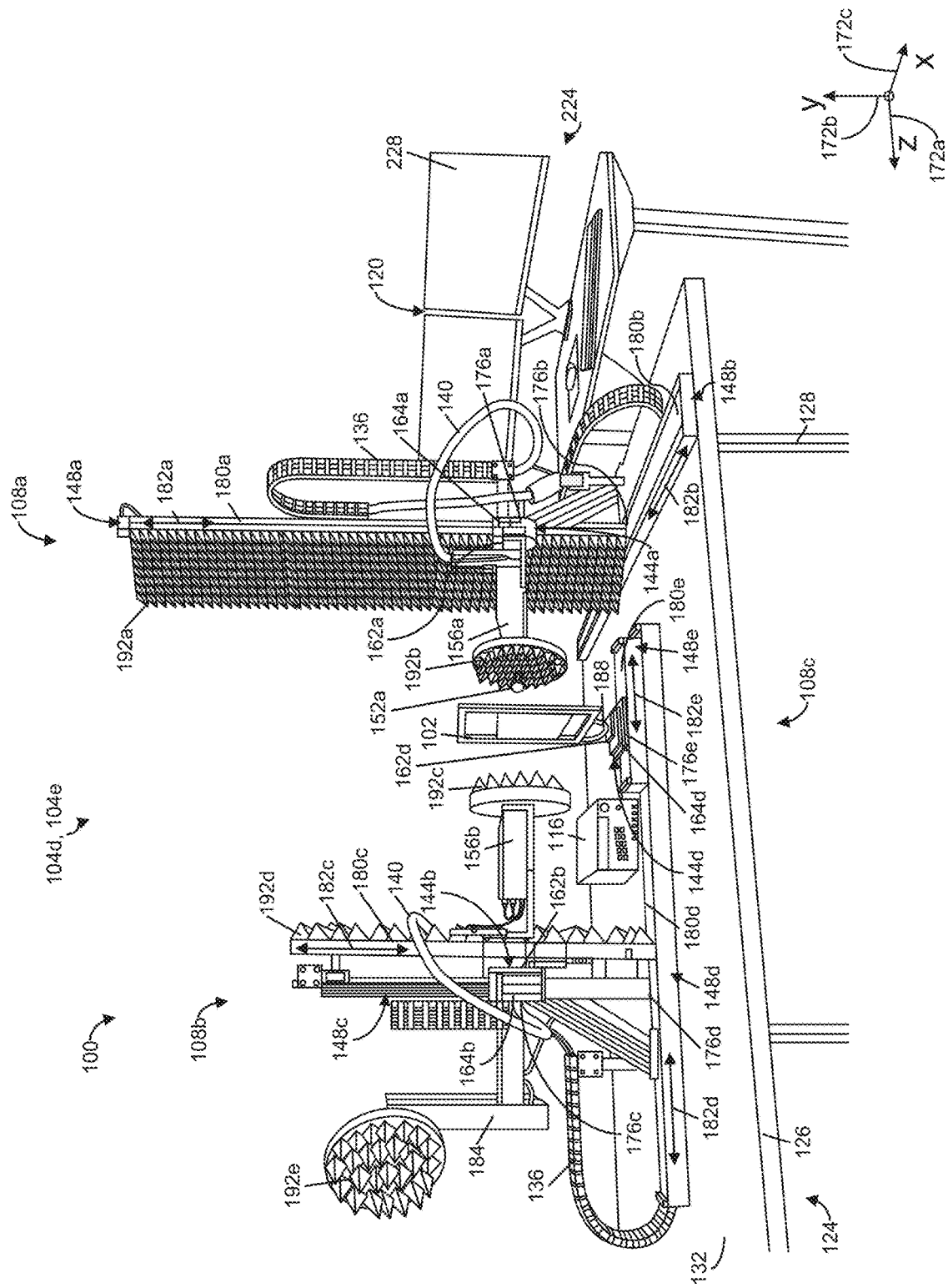
FIG. 8 is a perspective view of the multipurpose mmWave RF scanner configured for a material test mode and a radome test mode.

In the square marked by a dashed line in FIG. 8, two lens-corrected conical horn antennas are shown. The lens-corrected conical horn antennas generate a plane wavefront focused in the middle of the test device 102, which allows for characterizing and testing the test device 102 at a very short distance. The rotating motor 164d of the fourth rotary table 144d is controlled by the third subsystem 108c, and the material support 188 is attached to the rotation surface 162d of the fourth rotary table 144d, allowing the RF scanner system 100 to characterize a device under test at oblique incident angles.

For the material test mode 104d and the radome test mode 104e, calibration of the RF scanner system 100 is critical and needs to be done carefully. The one or more post-processing algorithm may include a time-domain filtering algorithm to mitigate errors caused by multi-path reflections within the fixture 252.

RTM Validation.

Figure 9A:
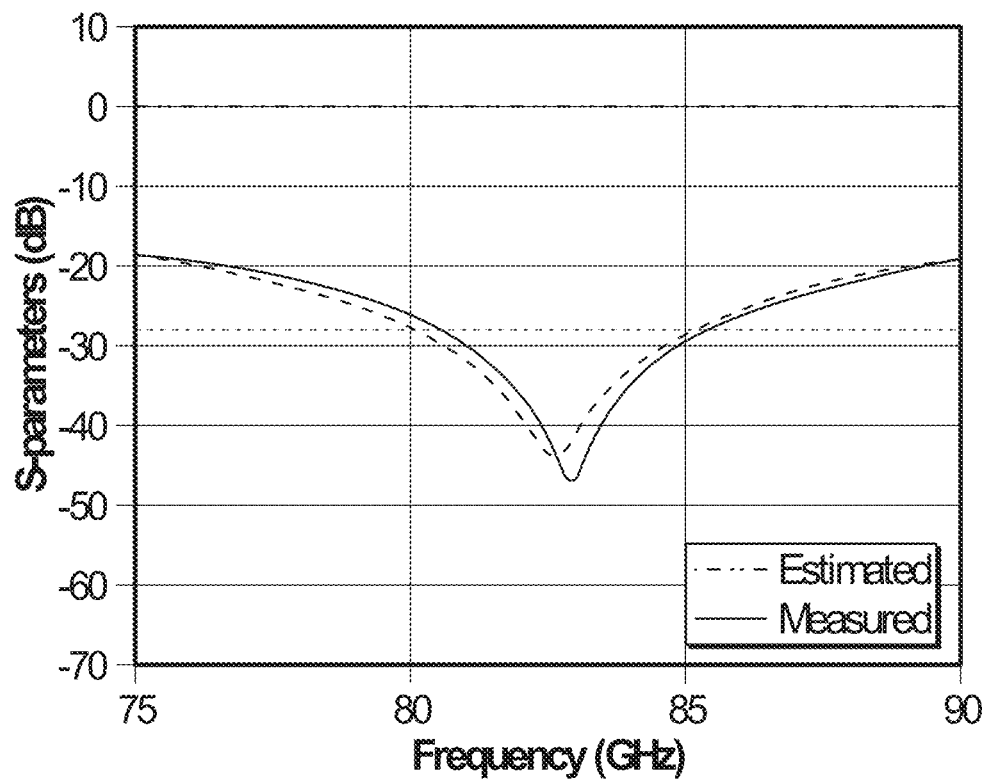
FIG. 9A shows simulated and measured S-parameters of a monolithic radome used as the test device in the frequency domain in the radome test mode.
Figure 9B:
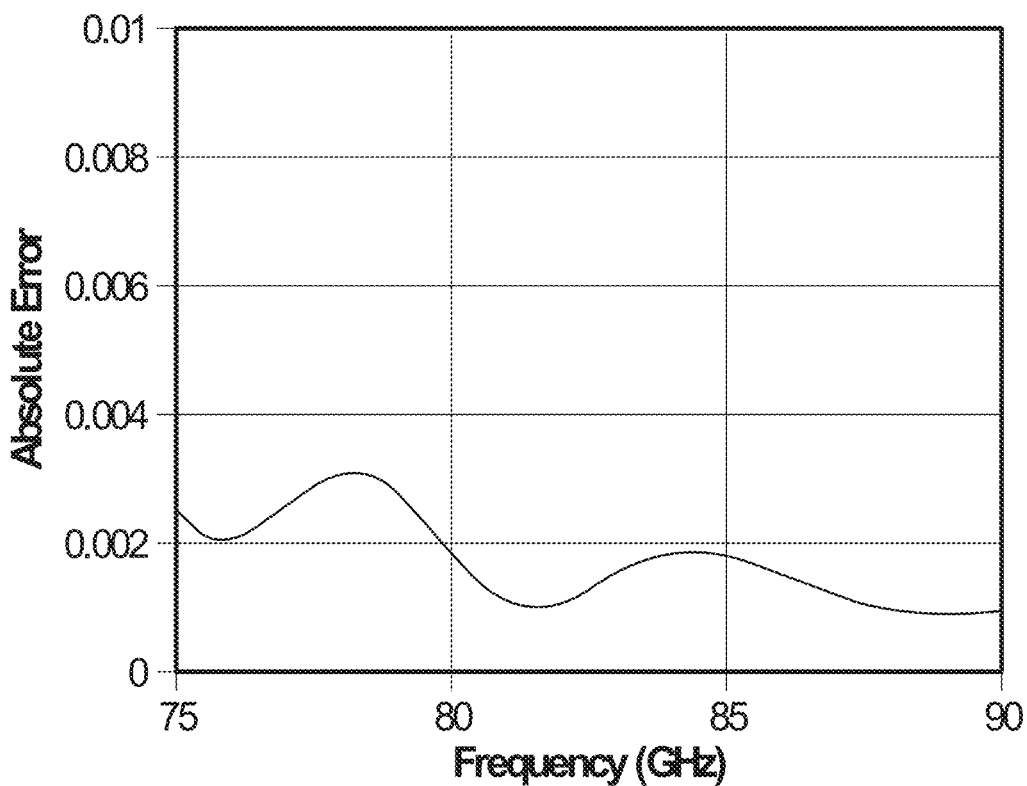
FIG. 9B shows the absolute error in the frequency domain of FIG. 9A.
Figure 9C:
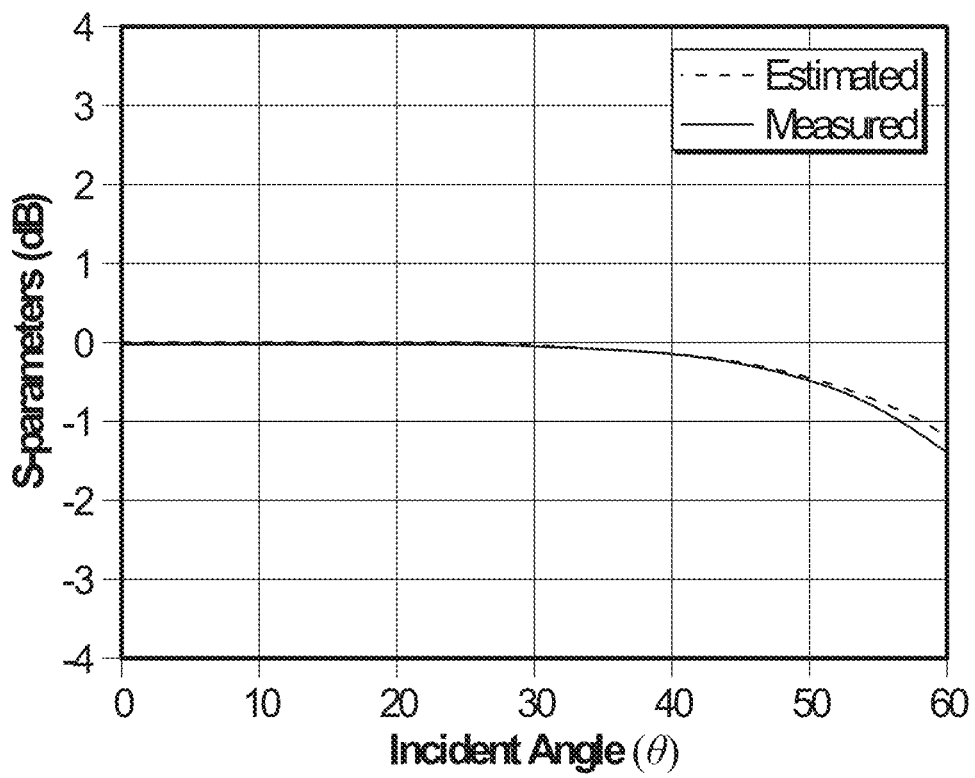
FIG. 9C shows simulated and measured S-parameters of a monolithic radome used as the test device in the incident angle domain.
Figure 9D:
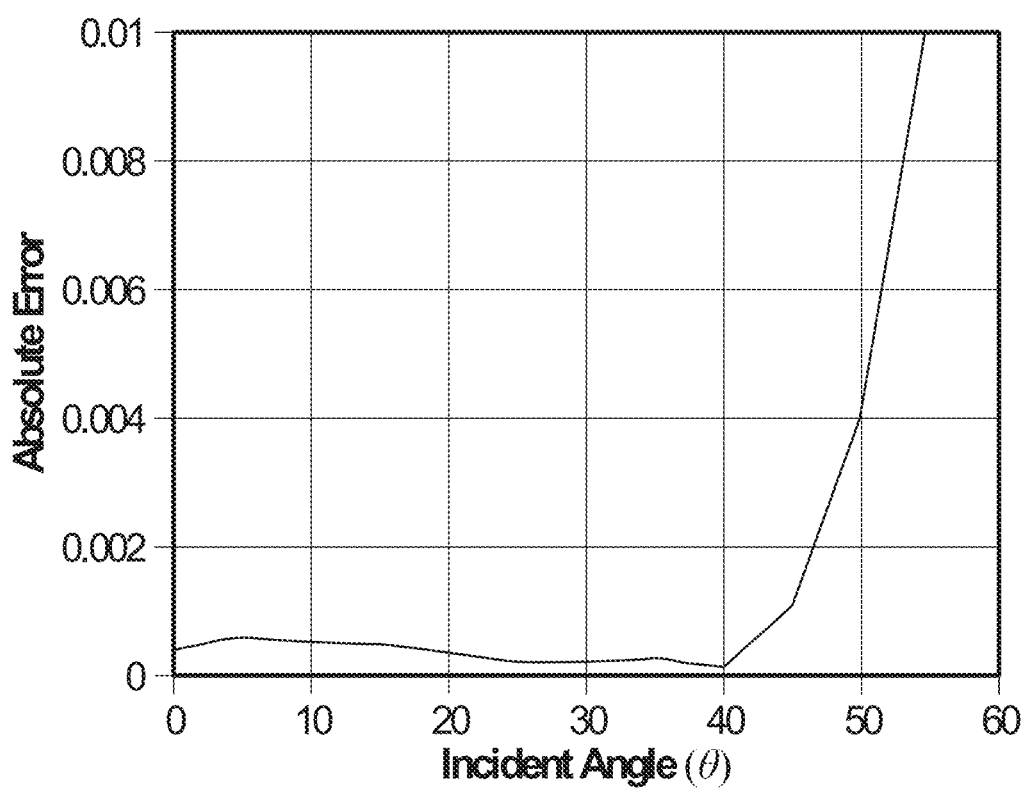
FIG. 9D shows the absolute error in the incident angle domain of FIG. 9C.

FIGS. 9A-9D illustrate the S-parameters of the test device 102, the test device 102 (in this instance, a test radome) being monolithic and having a single layer, designed to operate at about 82 GHz. FIG. 9A shows simulated and measured s-parameters ($S_{11}$) of the test device 102 in the frequency domain. FIG. 9B shows an absolute error for the $S_{11}$ in the frequency domain. FIG. 9C shows simulated and measured s-parameters ($S_{21}$) of the test device 102 in the incident angle domain. FIG. 9D shows the absolute error for the $S_{21}$ in the incident angle domain. The $S_{11}$ less than −20 dB were obtained for a frequency band from 78 GHz to 87 GHz. The $S_{21}$ less than −0.002 dB for incident angles less than 60° were obtained.

FIGS. 9A and 9C show comparisons of measured and simulated results obtained in Ansys HFSS. As is shown in FIG. 9B, a maximum absolute error of 0.0031 dB was obtained in the frequency domain; however, as is shown in FIG. 9D, a maximum absolute error of 0.01 dB was obtained for 45° in the angle domains.

Material Test Mode (MTM).

Figure 10B:
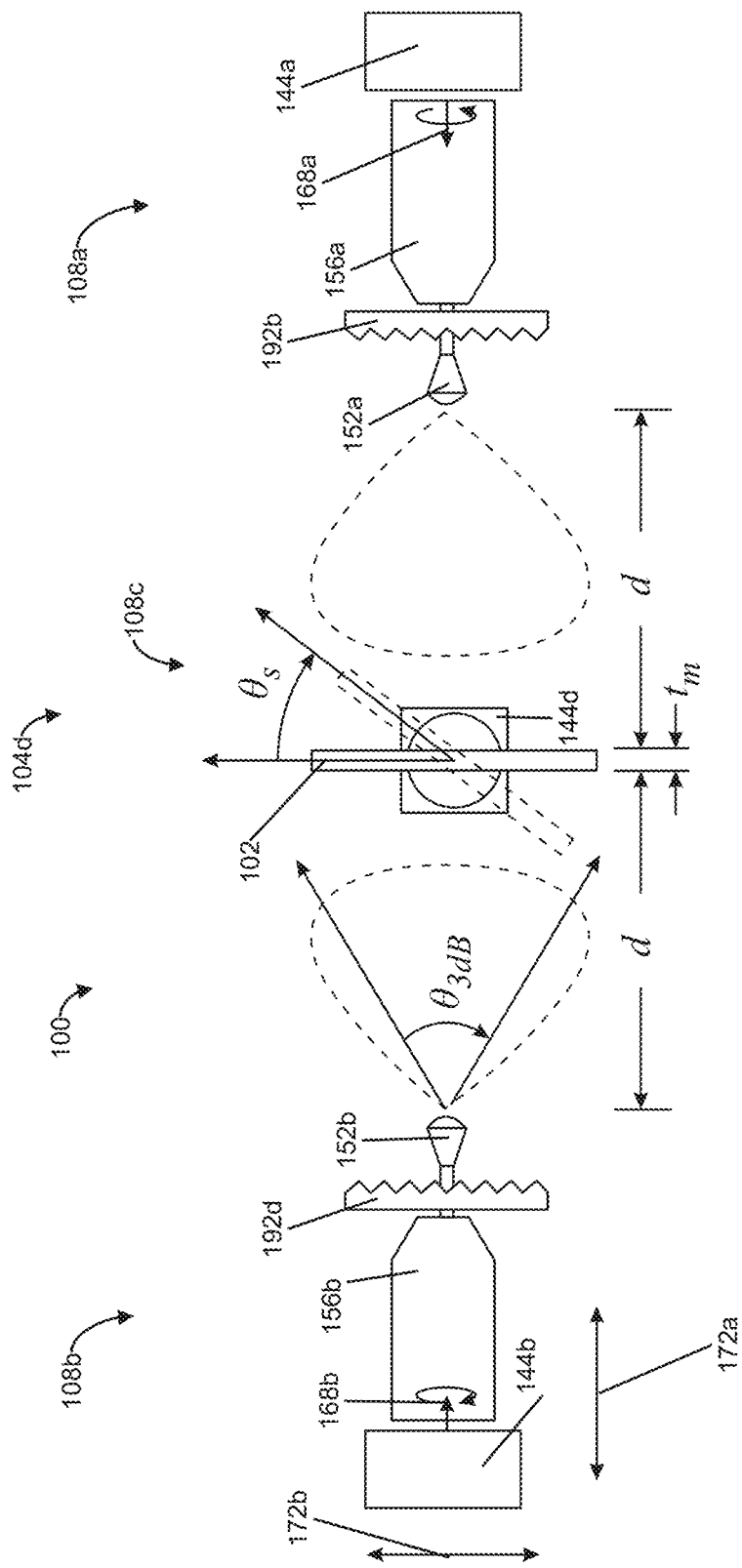
FIG. 10B is a schematic representation of a top view of the configuration of FIG. 10A for testing a material over incident angle θ.

To validate the material test mode 104d, the test device 102 (in this instance, a test material) is characterized in the frequency range from about 88 GHz to about 92.5 GHz. Similar to the radome test mode 104e, the same setup is used to characterize any isotropic dielectric materials. The configuration for the material test mode 104d is illustrated in FIGS. 10A-10B.

To achieve the precise intrinsic properties of the material (i.e., permittivity, permeability and tangent loss), "TRL" calibration and time-domain gating were used. TRL calibration uses "Thru", "Reflect", and "Line" standards to determine and remove error coefficient terms. The Thru standard is measured with no sample between the first probe antenna 152a and the second probe antenna 152b. The Reflect standard is measured by placing a metal plate between the first probe antenna 152a and the second probe antenna 152b; in this case, the second probe antenna 152b is moved back a distance equivalent to the thickness of the metal plate to achieve a constant distance as of Thru. The Line standard is measured by further moving the second probe antenna 152b back the distance of λ/4 at center frequency.

After the calibration, the second probe antenna 152b is moved back to its original position, after which a time-domain gating step is performed. The time-domain gating step may include converting a frequency-domain signal into a corresponding time-domain signal using an inverse fast Fourier transform (also referred to as "IFFT"), for example, applying a windowing function to the time-domain signal, and reversing the transform using a fast Fourier transform. The resulting signal has significantly less noise caused by reflections and impedance mismatches, allowing for an accurate characterization of the test device 102. In certain embodiments, the time-domain gating step is performed internally by the vector network analyzer 116; however, in other embodiments, the time-domain gating step is performed by the computer system 120. Once the calibration process is completed, a Smith algorithm may be used by the computer system 120 to retrieve the intrinsic properties (i.e., permittivity and tangent loss) of the test device 102.

MTM Validation.

Figure 11A:
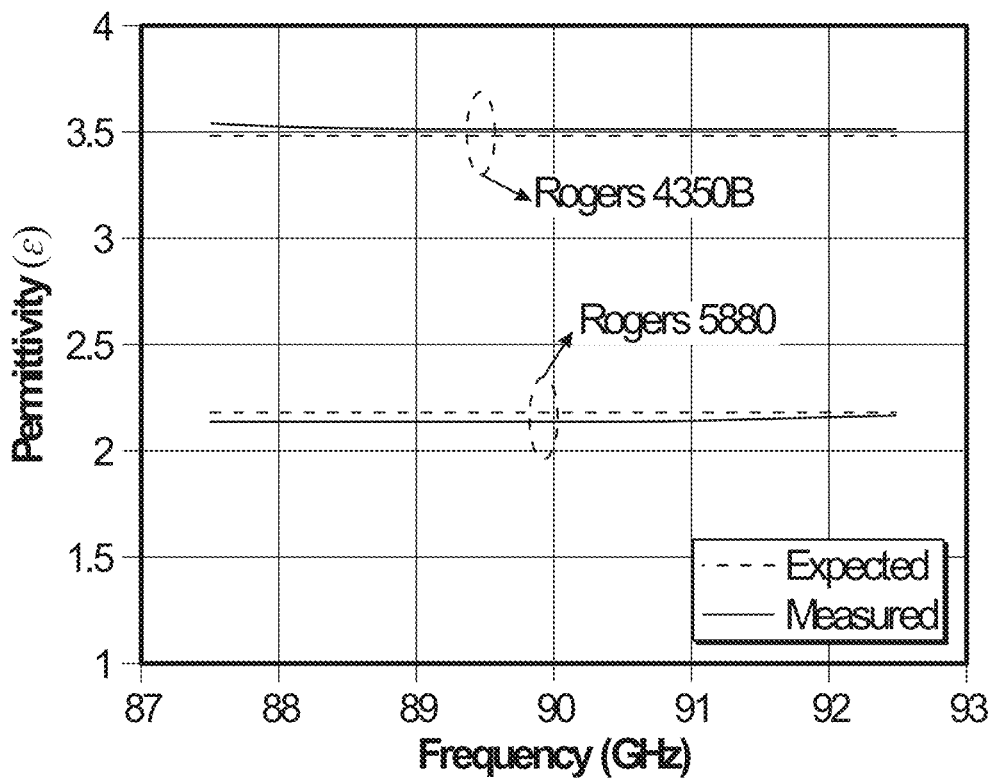
FIG. 11A shows a comparison between simulated and measured results obtained in the material test mode of constitutive electrical parameters for RF materials.
Figure 11B:
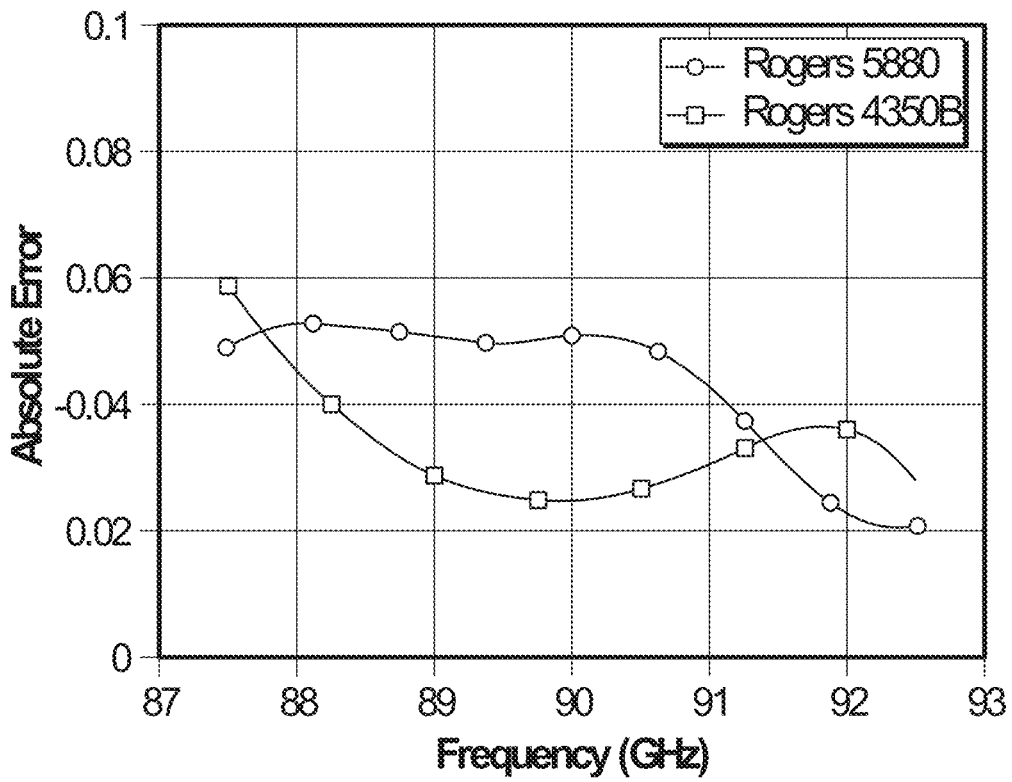
FIG. 11B shows the absolute error in permittivity vs. frequency of FIG. 11A.
Figure 11C:
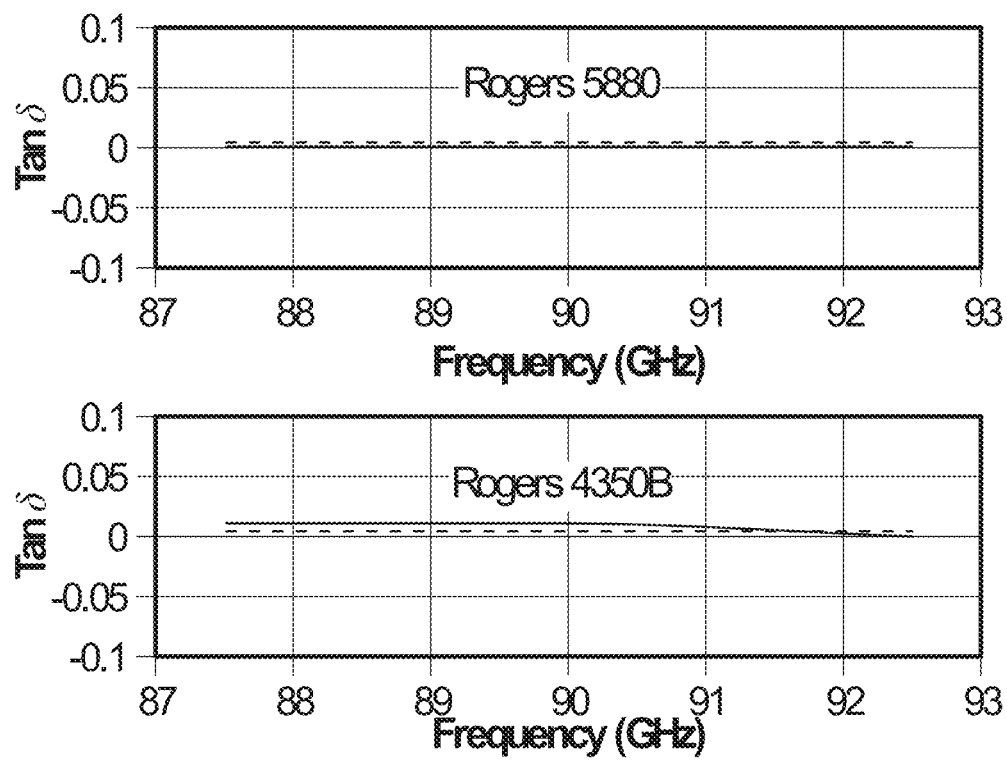
FIG. 11C shows a comparison between simulated and measured results obtained in the material test mode of constitutive electrical parameters for RF materials.

FIGS. 11A and 11C show the simulated and measured results of permittivity and tangent-loss, respectively, of Rogers 5880 and Rogers 4350B for the frequency band from 87.5 GHz to 92.5 GHz. For Rogers 5880, the permittivity is measured at 2.16 and the tangent loss ranges from 0.002 to 0.006. For Rogers 4350B, the permittivity is measured at 3.50 and tangent loss ranges from 0.0033 to 0.006.

FIG. 11C shows the absolute error of the measured permittivities of Rogers 5880 and Rogers 4350B compared to expected permittivities. The maximum absolute error of Rogers 5880 and Rogers 4350B are 0.05 and 0.06, respectively.

Figure 11D:
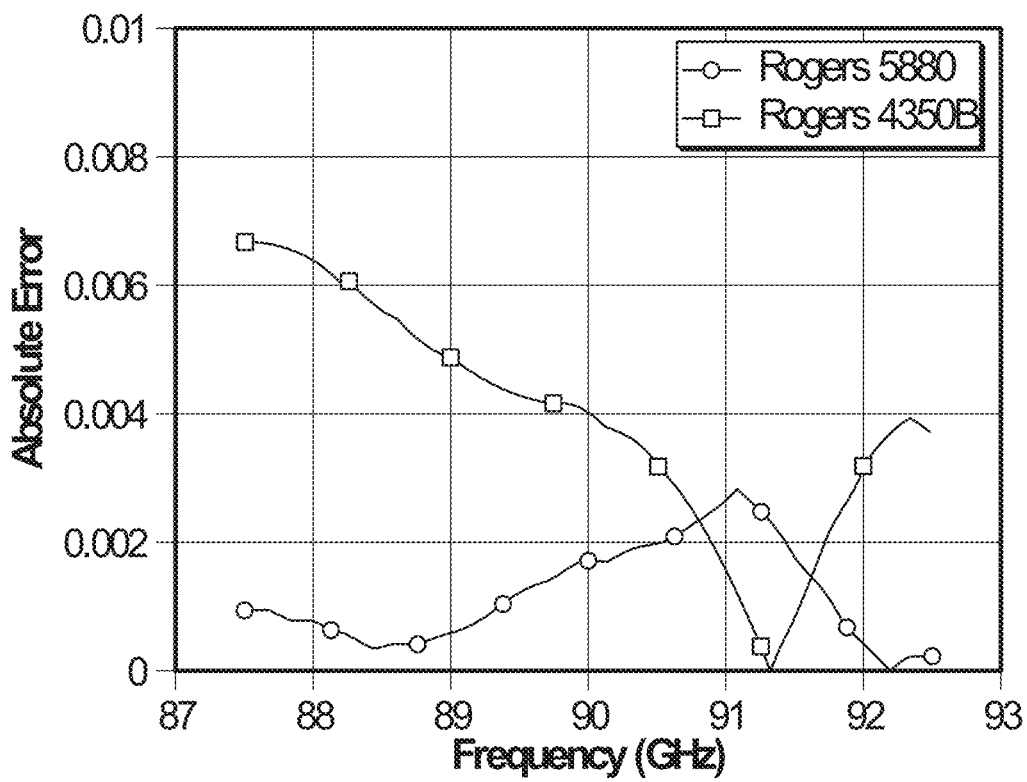
FIG. 11D shows the absolute error in tangent-loss vs. frequency of FIG. 11C.

FIG. 11D shows the absolute error of the measured tangent-losses of Rogers 5880 and Rogers 4350B compared to expected tangent-losses. The maximum absolute error of Rogers 5880 and Rogers 4350B are 0.0025 and 0.0068, respectively. TABLE 3 summarizes the measured results of Rogers 5880 and Rogers 4350B evaluated at 90 GHz. Those results were compared with simulated results in Ansys HFSS where the permittivity and tangent-loss used are provided in the datasheets for both materials.

TABLE 3

Summary of exemplary material characterization results using the material test mode.

| Material | Parameters | Specified (Datasheet) (10 GHz) | Simulated (HFSS) (90 GHz) | Measured (MTM) (90 GHz) | Absolute error (90 GHz) |
|---|---|---|---|---|---|
| Rogers 5880 | Permittivity ($\varepsilon_r$) Tangent loss (Tan$\delta$) | 2.2 ± 0.02 0.0026 | 2.19 0.0026 | 2.16 0.001 | 0.008 0.0016 |
| Rogers 4350B | Permittivity ($\varepsilon_r$) Tangent loss (Tan$\delta$) | 3.48 ± 0.02 0.0037 | 3.48 0.004 | 3.50 0.007 | 0.02 0.003 |

From the above description, it is clear that the inventive concepts disclosed and claimed herein are well adapted to carry out the objects and to attain the advantages mentioned herein, as well as those inherent in the invention. While exemplary embodiments of the inventive concepts have been described for purposes of this disclosure, it will be understood that numerous changes may be made which will readily suggest themselves to those skilled in the art and which are accomplished within the spirit of the inventive concepts disclosed and claimed herein.

What is claimed is:

1. A multipurpose mm wave radio frequency scanner system, comprising:
   a first subsystem comprising:
      a first rotary table having a first rotation axis aligned along a first-axis;
      at least two linear positioners supporting the first rotary table and configured to move the first rotary table along a second-axis and a third-axis; and

TABLE 1

General specifications of the exemplary multipurpose mm Wave RF system.

| Parameters | NFTM | ACTM | FFTM | MTM | RTM |
|---|---|---|---|---|---|
| Freq. operation | 75-110 GHz | 75-110 GHz | 75-110 GHz | 75-110 GHz | 75-110 GHz |
| Max. scanning range | 500 × 500 mm$^2$ | 500 × 500 mm$^2$ | 0° to 360° | −45° to +45° | −45° to +45° |
| AUT-Probe separation | 0-0.5 m | 0-0.5 m | 0-1.5 m | 0-0.3 m | 0-0.3 m |
| Max. DUT size | 500 mm | 500 mm | 370 × 370 mm$^2$ | 304 × 457 mm$^2$ | 304 × 457 mm$^2$ |
| Max. load capacity | 90 kg | 90 kg | 20 kg | 20 kg | 20 kg |
| Position accuracy | 0.076 mm | 0.076 mm | 100 arc-sec* | 100 arc-sec | 100 arc-sec |
| Repeatability | 0.0002 mm | 0.002 mm | 1 arc-sec | 1 arc-sec | 1 arc-sec |
| GUI | yes | yes | yes | yes | yes |
| Safety mode | yes | yes | yes | yes | yes |

*Units in arc-sec (1 arc-sec = 1/3600 of 1°)

TABLE 2

Exemplary Instrumentation specifications.

| Parameters | VNA (CMT C4209) | FE (CobaltFx FEV-10) |
|---|---|---|
| Freq. operation | 100 kHz to 9 GHz | 75 GHz to 110 GHz |
| Test power output | −60 dBm to 60 dBm | 0 dBm to 5 dBm |
| Dynamic range | 138 dB (142 dB typ.) | 100 dB (100 dB typ.) |
| Interface | N-Female | WR-10 |
| AC/DC power | 110-220 VAC (75 W) | 6 Vat 2.2 A |
| Weight | 7 kg | 3-5 kg |
| Temp. operation | 0° C. to 30° C. | 0° C. to 30° C. | a first frequency extender connected to and supported by the first rotary table whereby the first rotary table is configured to rotate the first frequency extender;

a second subsystem comprising:
   a second rotary table having a second rotation axis aligned along the first-axis;
   a third rotary table having a third rotation axis aligned along the third-axis;
   at least two linear positioners supporting the second rotary table and the third rotary table, and configured to move the second rotary table and the third rotary table along the first-axis and the third-axis; and
   a second frequency extender connected to and supported by either the second rotary table or the third rotary table, the second frequency extender spaced from the first frequency extender; and a vector network analyzer having a first port to receive first signals from the first frequency extender, and a second port to receive second signals from the second frequency extender.

2. The multipurpose mm wave radio frequency scanner system of claim 1, wherein the first-axis is a z-axis.

3. The multipurpose mm wave radio frequency scanner system of claim 1, wherein the second-axis is an x-axis.

4. The multipurpose mm wave radio frequency scanner system of claim 1, wherein the third-axis is a y-axis.

5. The multipurpose mm wave radio frequency scanner system of claim 1, further comprising a third subsystem positioned between the first subsystem and the second subsystem on the second support surface, the third subsystem comprising: a fourth rotary table having a fourth rotation axis along the third-axis; and a linear positioner supporting the fourth rotary table, the linear positioner configured to move the fourth rotary table along the first-axis; and a material support connected to the fourth rotary table, the material support configured to support a test material or a test radome.

6. The multipurpose mm wave radio frequency scanner system of claim 5, further comprising a first probe antenna connected to the first frequency extender, a second probe antenna connected to the second frequency extender, and a test material or a test radome connected to the material support.

7. The multipurpose mm wave radio frequency scanner system of claim 1, further comprising a probe antenna connected to the first frequency extender.

8. The multipurpose mm wave radio frequency scanner system of claim 1, further comprising a test antenna connected to the second frequency extender.

9. The multipurpose mm wave radio frequency scanner system of claim 1, wherein a probe antenna is connected to the first frequency extender, and a test antenna is connected to the second frequency extender.

10. The multipurpose mm wave radio frequency scanner system of claim 1, further comprising a first probe antenna connected to the first frequency extender, and a second probe antenna connected to the second frequency extender.

11. The multipurpose mm wave radio frequency scanner system of claim 1, further comprising a table supporting the first subsystem and the second subsystem.

12. A method, comprising:
providing a multipurpose mm wave radio frequency scanner system configured to be placed into a test mode selected from the group consisting of a near-field planar antenna test mode, an active array antenna calibration test mode, a far-field planar antenna test mode, a material test mode, and a radome test mode;
placing the multipurpose mm wave radio frequency scanner system into any one of the test modes; and
conducting a test on at least one of a test antenna, a test material, and a test radome with the multipurpose mm wave radio frequency scanner system.

13. The method of claim 12, further comprising the step of processing a result of the test using an algorithm selected from the group consisting of a fast Fourier transform, a phase retrieval, a probe correction, and a holographic projection.

14. The method of claim 12, wherein the step of placing the multipurpose mm wave radio frequency scanner system into any one of the test modes is further defined as connecting at least one of the test material and the test radome to a material support.

15. The method of claim 14, wherein the step of placing the multipurpose mm wave radio frequency scanner system into any one of the test modes is further defined as directing a probe antenna toward the material support and at least one of the test material and the test radome.

16. The method of claim 15, wherein the probe antenna is a first probe antenna, and wherein the step of placing the multipurpose mm wave radio frequency scanner system into any one of the test modes is further defined as directing a second probe antenna toward the material support and at least one of the test material and the test radome.

17. The method of claim 12, wherein the step of placing the multipurpose mm wave radio frequency scanner system into any one of the test modes is further defined as connecting the test antenna to a frequency extender.

18. The method of claim 17, wherein the step of placing the multipurpose mm wave radio frequency scanner system into any one of the test modes is further defined as directing a probe antenna toward the frequency extender and the test antenna.

19. The method of claim 12, wherein the step of placing the multipurpose mm wave radio frequency scanner system into any one of the test modes is further defined as performing a TRL calibration of the multipurpose mm wave radio frequency scanner system.

20. The method of claim 12, wherein the step of conducting the test on at least one of the test antenna, the test material, and the test radome with the multipurpose mm wave radio frequency scanner system is further defined as performing a row-by-row raster scan of at least one of the test antenna, the test material, and the test radome.

21. The method of claim 12, wherein the step of conducting the test on at least one of the test antenna, the test material, and the test radome with the multipurpose mm wave radio frequency scanner system is further defined as performing a column-by-column raster scan of at least one of the test antenna, the test material, and the test radome.

22. The method of claim 12, wherein the step of conducting the test on at least one of the test antenna, the test material, and the test radome with the multipurpose mm wave radio frequency scanner system is further defined as determining one or more scattering parameter of at least one of the test antenna, the test material, and the test radome.

* * * * *

UNITED STATES PATENT AND TRADEMARK OFFICE
CERTIFICATE OF CORRECTION

PATENT NO. : 11,867,738 B2
APPLICATION NO. : 17/364208
DATED : January 9, 2024
INVENTOR(S) : Jorge Luis Salazar-Cerreno Page 1 of 1

It is certified that error appears in the above-identified patent and that said Letters Patent is hereby corrected as shown below:

In the Specification

Column 14, Line 1: Delete "(e.g., 3A to 5A)" and replace with -- (e.g., $3\lambda$ to $5\lambda$) --

Column 15, Line 22: Delete "4A" and replace with -- $4\lambda$ --

Column 16, Line 32: After "position error of" delete "F" and replace with -- 1° --

Column 16, Line 56: After "device 102, and" delete "A" and replace with -- $\lambda$ --

Signed and Sealed this
Ninth Day of April, 2024

Katherine Kelly Vidal
*Director of the United States Patent and Trademark Office*